United States Patent
Fertner et al.

(10) Patent No.: US 10,707,916 B2
(45) Date of Patent: Jul. 7, 2020

(54) METHODS AND DEVICES FOR DETERMINING TERMINATION CHARACTERISTICS OF AN ELECTRICALLY CONDUCTIVE LINE

(71) Applicant: TELEFONAKTIEBOLAGET LM ERICSSON (PUBL), Stockholm (SE)

(72) Inventors: Antoni Fertner, Stockholm (SE); Miguel Berg, Sollentuna (SE); Daniel Cederholm, Sollentuna (SE); Per Ola Börjesson, Lund (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 119 days.

(21) Appl. No.: 15/749,601

(22) PCT Filed: Aug. 18, 2015

(86) PCT No.: PCT/SE2015/050875
§ 371 (c)(1),
(2) Date: Feb. 1, 2018

(87) PCT Pub. No.: WO2017/030474
PCT Pub. Date: Feb. 23, 2017

(65) Prior Publication Data
US 2018/0227014 A1    Aug. 9, 2018

(51) Int. Cl.
*G01R 27/28* (2006.01)
*H04B 3/46* (2015.01)
(Continued)

(52) U.S. Cl.
CPC ............ *H04B 3/46* (2013.01); *G01R 27/28* (2013.01); *G01R 31/11* (2013.01); *H04M 3/085* (2013.01); *H04M 3/30* (2013.01); *G01R 31/58* (2020.01)

(58) Field of Classification Search
CPC .......... G01R 27/28; H04M 3/085; H04M 3/30
See application file for complete search history.

(56) References Cited

U.S. PATENT DOCUMENTS

2002/0067802 A1    6/2002  Smith et al.
2005/0252884 A1*  11/2005  Lam ............... G05B 19/41875
                                                  216/59
(Continued)

OTHER PUBLICATIONS

International Search Report and Written Opinion, dated Apr. 25, 2016, from corresponding PCT Application No. PCT/SE2015/050875.

*Primary Examiner* — Alvaro E Fortich
(74) *Attorney, Agent, or Firm* — Patent Portfolio Builders PLLC

(57) ABSTRACT

The present disclosure relates to methods and devices for communication systems comprising an electrically conductive line. The disclosure proposes a method in a line estimation device for determining termination characteristics of an electrically conductive line in a communication system. The method comprises outputting a test signal to the line, wherein the test signal is a wideband test signal with a bandwidth arranged to provide an adequate measurement time-resolution. The method further comprises receiving reflections from impedance discontinuities of the line in response to the test signal. The method also comprises forming a trace of the reflections. The method additionally comprises identifying at least one anomaly in the trace of reflections. The method yet further comprises determining termination characteristics of the line based on characteristics of the trace before and after the identified at least one anomaly. The disclosure also relates to corresponding line estimation devices and computer programs.

14 Claims, 15 Drawing Sheets

(51) Int. Cl.
*H04M 3/30* (2006.01)
*H04M 3/08* (2006.01)
*G01R 31/11* (2006.01)
*G01R 31/58* (2020.01)

(56) References Cited

U.S. PATENT DOCUMENTS

| | | | |
|---|---|---|---|
| 2007/0152677 A1 | 7/2007 | Barsumian et al. | |
| 2011/0043244 A1* | 2/2011 | Hall | G01R 31/11 |
| | | | 324/764.01 |
| 2011/0063767 A1* | 3/2011 | Kasztenny | H02H 3/28 |
| | | | 361/66 |
| 2011/0304340 A1* | 12/2011 | Hall | G01R 31/11 |
| | | | 324/533 |
| 2015/0222511 A1* | 8/2015 | Fertner | H04B 3/493 |
| | | | 370/252 |
| 2015/0233976 A1* | 8/2015 | Johannesson | G01R 31/40 |
| | | | 324/764.01 |

\* cited by examiner

S500
Determining termination characteristics of the line based on characteristics of the trace before and after the identified at least one anomaly

S501
Determining if a segment of the line is terminated with a lumped element based on a drop of the reflection magnitudes following the at least one anomaly

S502
Determining the line segment as being characteristically terminated when the drop is larger than a predetermined threshold

S503
Determining correlation characteristics of the reflections before and after the at least one anomaly

S504
Determining if a first segment of the line has an open termination, is short-circuited or is followed by second segment of the line based on the correlation characteristics

S510
Determining impedance change at the at least one anomaly based on the magnitude of the reflection represented by the at least one anomaly

Fig 4

S503
Determining correlation characteristics of the reflections before and after the at least one anomaly

S505
Determining reflection symmetry characteristics of the reflections before and after the at least one anomaly

S506
Selecting a first subset of the trace, wherein the first subset comprises the at least one anomaly

S507
Determining a second subset based on the first subset adjusted for attenuation

S508
Determining a third and a fourth subset from the second subset, the third and fourth subset comprising subsets of the adjusted trace before and after the at least one anomaly, respectively

S509
Determining a correlation coefficient based on the third and fourth subset

Fig 6

S510
Determining impedance change at the at least one anomaly based on the magnitude of the reflection represented by the at least one anomaly

S511
Using a linear model approximation of the reflected signal power loss due to attenuation

S512
Applying a correction factor based on a model of forth to back transmission losses of the magnitude of the reflection represented by the at least one anomaly

S513
Ignoring reflection magnitudes of the reflections from impedance discontinuities before and after the at least one anomaly within a guard zone of the at least one anomaly, in order to reduce the influence of transients on the determination of the impedance change

Fig 14

METHODS AND DEVICES FOR DETERMINING TERMINATION CHARACTERISTICS OF AN ELECTRICALLY CONDUCTIVE LINE

TECHNICAL FIELD

The present disclosure relates to methods and devices for communication systems comprising an electrically conductive line. In particular the disclosure relates to methods and line estimation devices for determining termination characteristics of an electrically conductive line in a communication system. The disclosure also relates to corresponding computer programs.

BACKGROUND

The ever increasing demand for additional bandwidth in communication systems has put further focus on exploiting all available media, e.g. indoor cabling. Data transmission at short distances is now a topic of great interest, as small cells are used more and more to provide wireless coverage indoors and in well-defined regions with high bandwidth requirements, such as a university campus. Therefore, copper cables, such as twisted pair, are receiving renewed interest. Improved cables, such as Category 5, 6, 7 and 8 with their more stringent specifications for e.g. crosstalk and insertion loss, considerably extend the exploitable bandwidth.

In order to ensure reliable operation according to current and future technical standards and regulations, monitoring and diagnostics of deployed networks become more and more important. Hence it is beneficial for a network administrator to know line properties, such as quality, length and type of termination of the respective line segments, especially during the deployment of the telecommunication system.

Electrically conducting lines of a communication system can be examined with Time Domain Reflectometry, TDR, which is a measurement technique used to determine transmit characteristics through the reflections when an electrical impulse, or fast step, is propagated down a transmission line. Frequency Domain Reflectometry, FDR, is the frequency domain counterpart of TDR. Both are related through Fourier transformation. TDR/FDR can be used for determining the distance to the far-end of the line and/or for fault detection, fault localization and performance estimation. However, TDR as applied today is associated with some limitations. For instance, determining properties of electrically conductive lines, such as their length, termination and respective electrical parameters, is a challenging task, mainly due to the computational burden and difficulty in obtaining sufficient accuracy in the end result. Noise can be a significant source of error when measuring small variations in impedance. Attempts to reduce the effects of noise by performing signal averaging can be very demanding computationally and sometimes the measurement time must be short in order to minimize disturbance caused by the measurement signal. The type of line termination and its associated properties, such as its impedance, can be particularly difficult to determine due to difficulties in differentiating between different types of line termination.

TDR as applied today is based on the principle that each received signal results from a reflection of the original test signal at the interface between the test device and the line that is tested and reflections from all line terminations, segment changes, faults, etc.

One of the neglected limitations associated with TDR is the effect of numerous tiny imperfections resulting in small reflections (note that no two lines are exactly alike). Those multiple reflections blur the reflected signal and are perceived as an additional noise source. However, when an electrically conducting line is measured using narrowband signals, the measurement's limited time-resolution makes the imperfections undetectable.

The TDR peak is typically wide, attenuated and includes energy also from other reflection points besides the major reflection. The magnitude of an associated reflection coefficient is then difficult to estimate accurately. Phase distortion due to dispersion of the electrically conductive line also adversely affects precision of the estimate. This is also a significantly contributing factor for uncertainty in the calculation of the reflection coefficient and/or interesting features of the electrically conductive line. An uncertainty of the estimates arises also from the imperfect line equipment setup and calibration.

A further source of uncertainty arises from the question of whether the termination can be regarded as a lumped element or a distributed termination. A trace can be formed from received reflections from impedance discontinuities. A trace of reflections is a function representing magnitudes of reflections over a period of time. For characteristically or almost characteristically terminated lines, TDR as applied today often fails to detect the line end, which means that the line will appear to be infinitely long. When the line end is open or short-circuited, the TDR trace continues undisrupted except a visible, distinct reflection at the end of the line. It is currently quite challenging to determine if the continuation of the TDR trace after the distinct reflection is due to internal reflections or due to following line segments.

Thus, there is a need in the art for new line estimation methods and devices that are able to determine line termination and determine line termination characteristics.

SUMMARY

An object of the present disclosure is to provide methods and devices which seek to mitigate, alleviate, or eliminate one or more of the above-identified deficiencies in the art and disadvantages singly or in any combination and to provide methods and devices for determining termination characteristics of an electrically conductive line in a communication system.

One embodiment provides a method, performed in a line estimation device, for determining termination characteristics of an electrically conductive line in a communication system. The method comprises outputting a test signal to the line, wherein the test signal is a wideband test signal with a bandwidth arranged to provide an adequate measurement time-resolution.

The method further comprises receiving reflections from impedance discontinuities of the line in response to the test signal and forming a trace of the reflections. The method additionally comprises identifying at least one anomaly in the trace of reflections and determining termination characteristics of the line based on characteristics of the trace before and after the identified at least one anomaly.

The words "measurement time-resolution" refer to the time-resolution of a measurement. The time-resolution is manifested in how well reflections due to impedance discontinuities are resolved in the trace, as is explained in more detail below in relation to the term "adequate".

The term "adequate", in relation to "adequate measurement time-resolution" is related to how well reflections due to impedance discontinuities are resolved in the trace. As has been discussed above, when contributions to the trace are superimposed on one another, finer features of the trace are smoothened to a point where they cannot be distinguished from one another. Furthermore, the TDR peak is typically wide, attenuated and includes energy also from other reflection points besides the major reflection. Each line has a unique set of impedance discontinuities due to numerous tiny imperfections. The unique set of impedance discontinuities will result in small reflections in response to a test signal. The term adequate means that the bandwidth of the test signal is sufficiently wide so that the small reflections in response to a test signal can be resolved. This in turn means that the influence of transients on major reflections can be determined. Furthermore, the presence and onset of a noise floor is distinguishable from major reflections and attenuation, wherein the noise floor is a measure of the signal created from the sum of all the noise sources and unwanted signals within a measurement system, where noise is defined as any signal other than the one being monitored. In general, the noise floor imposes a limit below which the signal of interest cannot be separated from the noise and hence it also limits the reach of the measurement. Additionally, the attenuation of a line is distinguishable to such a degree that its effect on the trace can be essentially separated from other effects on the trace. Also, reflections due to impedance discontinuities before and after a major reflection are distinguishable from each other.

By using the proposed method, determination of termination characteristics of an electrically conductive line in a communication system is improved in several ways compared to prior art methods. One aspect of termination characteristics is the type of termination. The proposed method allows for detecting the end of the line. The proposed method is further able to determine whether a line is terminated, even if it is characteristically terminated. The proposed method also allows for distinguishing whether the line is open, short-circuited or followed by another line segment. The proposed method is also able to determine the magnitude of the reflection coefficient associated with a change of impedance at the line termination. The proposed method can be implemented in a communication device. The proposed method can be implemented in a line estimation device. The proposed method can also be implemented without the need for complex, dedicated and expensive instrumentation operated by a workforce in the field, which result in cost-efficient solutions for determining termination characteristics of an electrically conductive line.

According to an aspect, the trace comprises a set of measured intra-segment reflections. If the trace comprises a set of measured intra-segment reflections, the measurement's time-resolution of the trace is easy to vary by varying the bandwidth. Furthermore, the trace comprising a set of measured intra-segment reflections facilitates modelling and analysis of line termination characteristics. In particular, the trace comprising a set of measured intra-segment reflections facilitates the study of correlation characteristics about the at least one anomaly of the trace. The set of measured intra-segment reflections enables a study of the reflection symmetry of the trace about the at least one anomaly.

According to an aspect, determining termination characteristics comprises determining if a segment of the line is terminated with a lumped element based on a drop of the reflection magnitudes following the at least one anomaly.

By securing adequate measurement time-resolution, i.e. that enables the detection of impedance discontinuities of the line, the received reflections from impedance discontinuities of a line terminated with a lumped element will manifest itself as a drop of the reflection magnitudes following the at least one magnitude. That is, identifying a drop of the reflection magnitudes following the at least one anomaly enables an indisputable way of determining if the line is terminated with a lumped element. This is in contrast to narrow-band signals, where a lumped element, in particular when the impedance is matched with the line, will appear to absorb the narrow-band test signal and the line will appear as an infinitely long line.

According to a further aspect, determining if a segment of the line is terminated with a lumped element further comprises determining the line segment as being characteristically terminated when the drop is larger than a predetermined threshold.

In contrast to conventional methods that fail to detect line end, especially when the line is characteristically terminated and the line seems to be infinitely long, the proposed method enables an operator to conclusively determine if a segment of the line is terminated with a lumped element. In particular, the method is also able to determine if the line segment is characteristically terminated, which is typically a very challenging task.

According to an aspect, determining termination characteristics comprises determining correlation characteristics of the reflections before and after the at least one anomaly and determining if a first segment of the line has an open termination, is short-circuited or is followed by a second segment of the line based on the correlation characteristics.

When the line has an open termination or short circuited, the trace continues undisrupted, except for an anomaly in the form of a distinct reflection at the end of the line. By determining the correlation characteristics of the reflections before and after the at least one anomaly, the ambiguity of whether the undisrupted continuation is produced by internal reflections or by a following line segment can be conclusively resolved.

According to an aspect, determining correlation characteristics comprises determining reflection symmetry characteristics of the reflections before and after the at least one anomaly by selecting a first subset of the trace, wherein the first subset comprises the at least one anomaly, determining a second subset based on the first subset adjusted for attenuation, determining a third and a fourth subset from the second subset, the third and fourth subset comprising subsets of the adjusted trace before and after the at least one anomaly, respectively, and determining a correlation coefficient based on the third and fourth subset.

By selecting a first subset of the trace comprising the at least one anomaly, the computational complexity relating to determining the correlation characteristics is reduced. Furthermore, by selecting the first subset, it is possible to define a region of interest relating to the correlation characteristics, while simultaneously eliminating parts of the trace that may complicate or reduce the accuracy of determining the correlation characteristics. By determining a second subset based on the first subset adjusted for attenuation, attenuation trends apparent in the trace is accounted for before determining the correlation characteristics. By scaling the reflection magnitudes and/or performing coordinate transformations, the impact of attenuation on determining correlation characteristics can be reduced, thereby improving accuracy when determining the correlation characteristics. By determining a third and fourth subset from the second subset, wherein the third and fourth subset comprises subsets of the adjusted trace before and after the at least one anomaly, respectively, and determining a correlation coefficient based on the third and fourth subset, it is possible to distinguish between a termination being open/short circuited or followed by another line segment based on the correlation coefficient.

According to an aspect, the correlation coefficient is defined to show no correlation between the third subset and a reverse order of the fourth subset at the at least one anomaly if the first segment is followed by a second segment and also defined to show a correlation between the third subset and a reverse order of the fourth subset at the at least one anomaly if the first segment is terminated with an open end or is short circuited. By defining the correlation coefficient to show no correlation between the third subset and a reverse order of the fourth subset at the at least one anomaly if the first segment is followed by a second segment and also to show a correlation between the third subset and a reverse order of the fourth subset at the at least one anomaly if the first segment is terminated with an open end or is short circuited, the correlation coefficient is defined to take advantage of the reflection symmetry characteristics of the line termination. Measurements utilizing a high measurement bandwidth reveal complicated patterns corresponding to local fluctuations of the characteristic impedance. Those patterns are invariable in time, characteristic for each individual line and there are no two lines with an identical pattern. Thus, a trace relating to intra-segment reflections from a second line segment will show no correlation with intra-segment reflections from a first line segment. On the other hand, intra-segment reflections before the at least one anomaly resulting from an open end or a short circuit will result from the same line segment as intra-segment reflections after the at least one anomaly appearing in reverse order. Hence, a correlation coefficient defined to take these correlation characteristics into account, as is done in this embodiment, will be able to use the correlation characteristics to distinguish between a case where the line termination is a second line segment following a first line segment or a case where the line termination is open or a short circuit.

According to an aspect, each identified anomaly represents a reflection from a respective impedance discontinuity, the reflection having a magnitude defining a peak of the trace. By having each identified anomaly representing a reflection from a respective impedance discontinuity, the reflection having a magnitude defining a peak of the trace, it is possible to relate the impedance discontinuity to a peak of the trace. Relating the impedance discontinuity to a peak of the trace, it is possible to determine the change in impedance at the discontinuity based on the peak characteristics, in particular the associated magnitude of the reflection.

According to an aspect, determining termination characteristics comprises determining impedance change at the at least one anomaly based on the magnitude of the reflection represented by the at least one anomaly.

The measurement time-resolution defined by the wideband test signals applied to measurements enable the at least one anomaly to be well resolved, which in turn enables the magnitude of the reflection represented by the at least one anomaly to be determined with high accuracy. By determining impedance change based at the at least one anomaly based on the magnitude of the reflection represented by the at least one anomaly enables determining the impedance change at the at least one anomaly with good precision. By determining the impedance change at the at least one anomaly, impedance matching quality with a lumped element is determined. This is useful for detecting faults at a connection to an external device or determining that the connection to an external device has a problem, e.g. a connector of the external device is not properly connected to a socket at a termination point of the line.

According to an aspect, determining impedance change comprises using a linear model approximation of the reflected signal power loss due to attenuation. The linear model approximation allows for a convenient and computationally efficient estimation of the magnitude of reflection coefficients at the line termination.

According to an aspect, determining impedance change comprises applying a correction factor based on a model of forth to back transmission losses of the magnitude of the reflection represented by the at least one anomaly. By applying the correction factor, it is possible to compensate for a reduction of the peak magnitude due to the forth and back transmission losses. Furthermore, the correction factor can be based entirely on measurement values, which means that results corrected with the correction factor are better grounded in reality compared to a correction based on nominal or cable model values. Additionally, it is not necessary to use previously calculated or estimated properties or values while determining actual ones. The risk for error propagation and/or error accumulation is therefore eliminated, which improves accuracy further.

According to an aspect, determining impedance change comprises ignoring reflection magnitudes of the reflections from impedance discontinuities before and after the at least one anomaly within a guard zone of the at least one anomaly, in order to reduce the influence of transients on the determination of the impedance change.

A guard zone is here defined as an interval in which reflection magnitudes from impedance discontinuities are ignored. By using a guard zone comprising the at least one anomaly, the influence of transients on the determination of the impedance change can be reduced. By reducing the influence of transients on the determination of the impedance change, the accuracy of the determination of the impedance change is improved.

The present disclosure also relates to a line estimation device arranged to determine termination characteristics of an electrically conductive line in a communication system. The line estimation device comprises processing circuitry. The processing circuitry is configured to output a test signal to the line, wherein the test signal is a wideband test signal with a bandwidth arranged to provide an adequate measurement time-resolution. The processing circuitry is further configured to receive reflections from impedance discontinuities of the line in response to the test signal. The processing circuitry is also configured to form a trace of the reflections. The processing circuitry is additionally configured to identify at least one anomaly in the trace of reflections. The processing circuitry is yet further configured to determine termination characteristics of the line based on characteristics of the trace before and after the identified at least one anomaly. The proposed line estimation device is thereby arranged to carry out the proposed method, thereby having all the associated advantages.

According to an aspect, the line estimation device further comprises a test port having known impedance, and the line estimation device is further adapted to output the test signal to the line via the test port.

A test port enables the line estimation device to be implemented as an external testing device. The known impedance of the test port serves as a reference, which enable estimates of impedance changes along the line, based on received reflections from impedance discontinuities of the line in response to the test signal.

The present disclosure also relates to a computer program comprising computer program code which, when executed in a line estimation device causes the line estimation device to execute a method according to any of claims 1-12.

The computer program will have all the above mentioned advantages relating to the disclosed method.

BRIEF DESCRIPTION OF THE DRAWINGS

The foregoing will be apparent from the following more particular description of the example embodiments, as illustrated in the accompanying drawings in which like reference characters refer to the same parts throughout the different views. The drawings are not necessarily to scale, emphasis instead being placed upon illustrating the example embodiments.

FIG. 4 is a flowchart illustrating embodiments of method steps for determining termination characteristics of an electrically conductive line in a communication system;

FIG. 6 illustrates aspects of determining correlation characteristics of reflections before and after at least one anomaly;

FIG. 14 is a flowchart illustrating embodiments of method steps for determining impedance change at the at least one anomaly;

DETAILED DESCRIPTION

Figure 1:
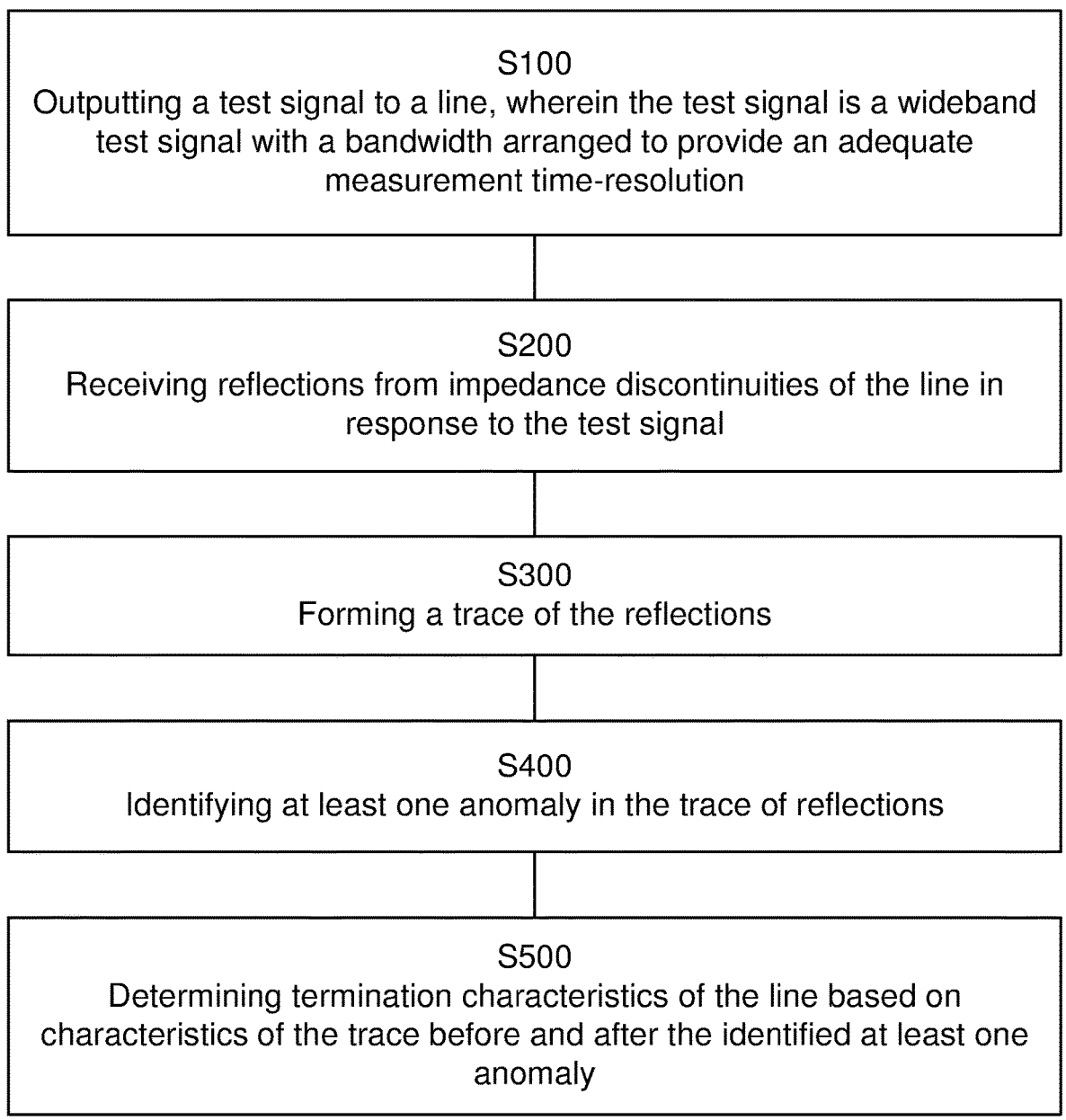
FIG. 1 is a flowchart illustrating method steps for determining termination characteristics of an electrically conductive line in a communication system.

Aspects of the present disclosure will be described more fully hereinafter with reference to the accompanying drawings. The devices and method disclosed herein can, however, be realized in many different forms and should not be construed as being limited to the aspects set forth herein. Like numbers in the drawings refer to like elements throughout.

The terminology used herein is for the purpose of describing particular aspects of the disclosure only, and is not intended to limit the invention. As used herein, the singular forms "a", "an" and "the" are intended to include the plural forms as well, unless the context clearly indicates otherwise.

FIG. 1 is a flowchart illustrating method steps for determining termination characteristics of an electrically conductive line in a communication system. The illustrated method is a method, performed in a line estimation device, for determining termination characteristics of an electrically conductive line in a communication system. The method comprises outputting S100 a test signal to the line, wherein the test signal is a wideband test signal with a bandwidth arranged to provide an adequate measurement time-resolution. As the test signal propagates through the line, intra-segment reflections will occur as the signal is partially reflected due to local impedance differences, as well as due to reflections occurring at points of line termination. The method further comprises receiving S200 reflections from impedance discontinuities of the line in response to the test signal. Measurements utilizing high bandwidth, e.g. 400 MHz, reveal complicated patterns corresponding to local fluctuations of the characteristic impedance. Such patterns are invariable in time, characteristic for each individual line and there are no two lines with an identical pattern.

The method also comprises forming S300 a trace of the reflections. A trace of reflections is a function representing magnitudes of reflections over a period of time, which is often transformed to distance, as will be illustrated in e.g. FIG. 2. The magnitude of a reflection coefficient relating to a reflection does not depend on the length of the line, only on the impedance before and the impedance after the reflection. The shape of a peak in the trace can be regarded as a superposition of a number of waves plus a spectral leakage from adjacent small reflections. When using a narrow frequency band the peak is wide, attenuated and include energy also from other reflection points besides the major reflection. The magnitude of the reflection coefficient is then difficult to estimate accurately, since the reflection of interest can not be isolated from the other reflections. Wideband analysis greatly limits the adverse influence of these phenomena. The impulse response is smaller and hence spectral leakage less emphasized, and thus errors associated with interference from overlapping signals are reduced. Each reflection at an impedance discontinuity is better resolved, which means that a trace formed based on reflections from a high bandwidth test signal, a trace being a function of received signal amplitudes with respect to receive time or a function thereof, is able to resolve more detailed features than a trace formed based on reflections from a low bandwidth test signal. The method additionally comprises identifying S400 at least one anomaly in the trace of reflections. The anomaly will typically comprise a peak in the trace corresponding to a major reflection at a termination of a segment of the line. The method yet further comprises determining S500 termination characteristics of the line based on characteristics of the trace before and after the identified at least one anomaly. According to an aspect, the trace comprises a set of measured intra-segment reflections. By performing measurements of the reflected test signal, a set of measured intra-segment reflections is obtained. The trace formed based on the received reflections comprises a set of measured intra-segment reflections which facilitates modelling and analysis of line termination characteristics. In particular, the trace comprising a set of measured intra-segment reflections facilitates the study of correlation characteristics about the at least one anomaly of the trace. The set of measured intra-segment reflections enables a study of the reflection symmetry of the trace about the at least one anomaly.

Various embodiments of the proposed method will follow below. The embodiments will be illustrated using time domain reflectometry, TDR, to output a wideband test signal on the line on which termination characteristics is to be determined. The received reflections from impedance discontinuities of the line in response to the test signal are interpreted based on a model considering the electrically conducting line as an entity that reflects electromagnetic pulses. Details of the model are illustrated below.

FIGS. 2, 5, 7-10, 15 and 16 illustrate TDR traces that are based on an Inverse Fast Fourier Transformation, IFFT, of a corresponding frequency domain reflectometry, FDR, trace.

According to an aspect, the transmission line is considered as a scattering medium, wherein each change of characteristic impedance constitutes a reflecting point. The reflecting points can be randomly located and be of different magnitude and polarity. The phenomenon of intra-segment reflections has its source in tiny reflections as electromagnetic wave travels to the line end. Each reflection insignificantly reduces the transmitted energy while reversing propagation of a portion of the electromagnetic wave in the opposite direction. Common causes for intra-segment reflections are variation of conductor diameter, spacing between conductor pairs, variation in dielectric constant, wire thickness and many others factors which can be reduced to fluctuation of the characteristic impedance along the transmission line. The intensity of each reflection is a function of scattering paths and a reflection coefficient, $\rho$, as well as its fluctuations. Reflection coefficient fluctuations are thought of as random processes in time-space domain, having finite average value and variance. For the modern, high quality cables, such as the Category 5, 6, 7 and 8 cables previously discussed, the variation of the characteristic impedance is fairly small, whereas distances between consecutive reflections are quite short. The main reason why the phenomenon was not observed earlier is because earlier communication systems used lower bandwidth. The superior quality and manufacturing accuracy of Ethernet cables enable the use of wide bandwidth communication systems, which in turn enable wider bandwidth test signals for TDR. The use of wide bandwidth signals enable interpreting the TDR trace as a reflected signal with termination characteristics depending on the type of termination as well as other factors, such as impedance change at the line termination.

Figure 2:
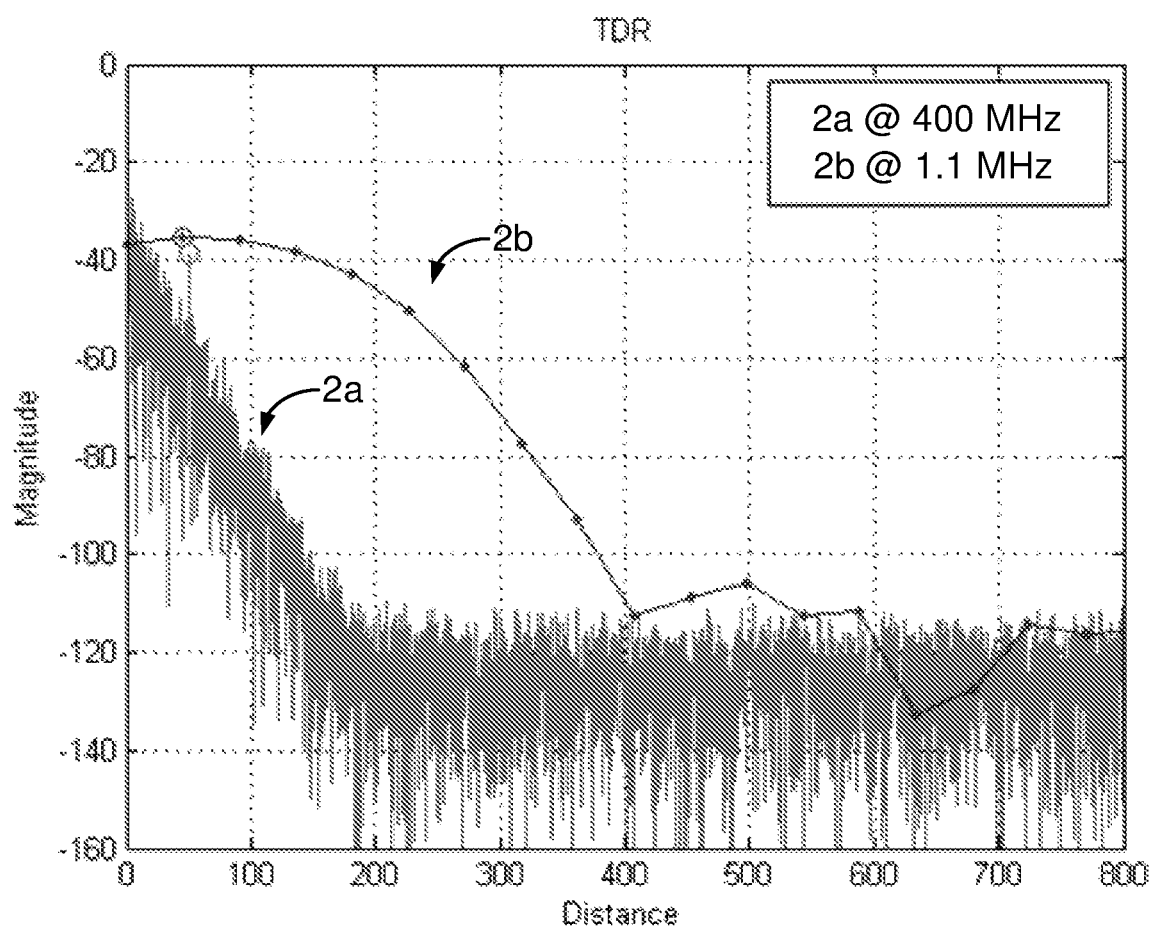
FIG. 2 illustrates the qualitative difference between measurements within the DSL frequency band and between measurements made using much wider measurement bandwidth.

FIG. 2 illustrates a qualitative difference between measurements within the ADSL2 frequency band and between measurements made using much higher bandwidth, up to 400 MHz. The horizontal axis illustrates distance to a point on the line, determined based on received reflections from impedance discontinuities of the line in response to the test signal. The vertical axis illustrates magnitude of the received reflections in units of decibel, dB. Two traces 2a, 2b are illustrated, each being formed by forming a function of measurement points with respect to the time of measurement, the time of measurement determining a corresponding distance traveled by the test signal based on a signal propagation velocity of the test signal in the line, at measurement bandwidths of 400 MHz, trace 2a, and 1.1 MHz, trace 2b, respectively. Both traces show a local maximum at a distance of about 50 distance units, marked by respective circles in the respective traces in FIG. 2. The shape of the peak in the trace 2b can be regarded as a superposition of a number of waves plus a spectral leakage from adjacent small reflections. When using a narrow frequency band of 1.1 MHZ, the peak is wide, attenuated and includes energy from other reflection points on the major reflection at about 50 distance units. The lack of distinguishable features of the trace and uncertainty of the exact peak position makes the magnitude of reflection coefficient difficult to estimate accurately. Trace 2a shows a much better measurement time-resolution of the line and the peak at 50 distance units is clearly distinguishable. The peak being narrow indicates that spectral leakage affecting the peak is low and the contribution from superposition of a number of waves is likely to be low as well. Furthermore, the effect of attenuation is clearly visible as a noisy straight line between about 0 to 180 distance units. Therefore, the magnitude of the reflection coefficient can be estimated with a high degree of accuracy.

Figure 3:
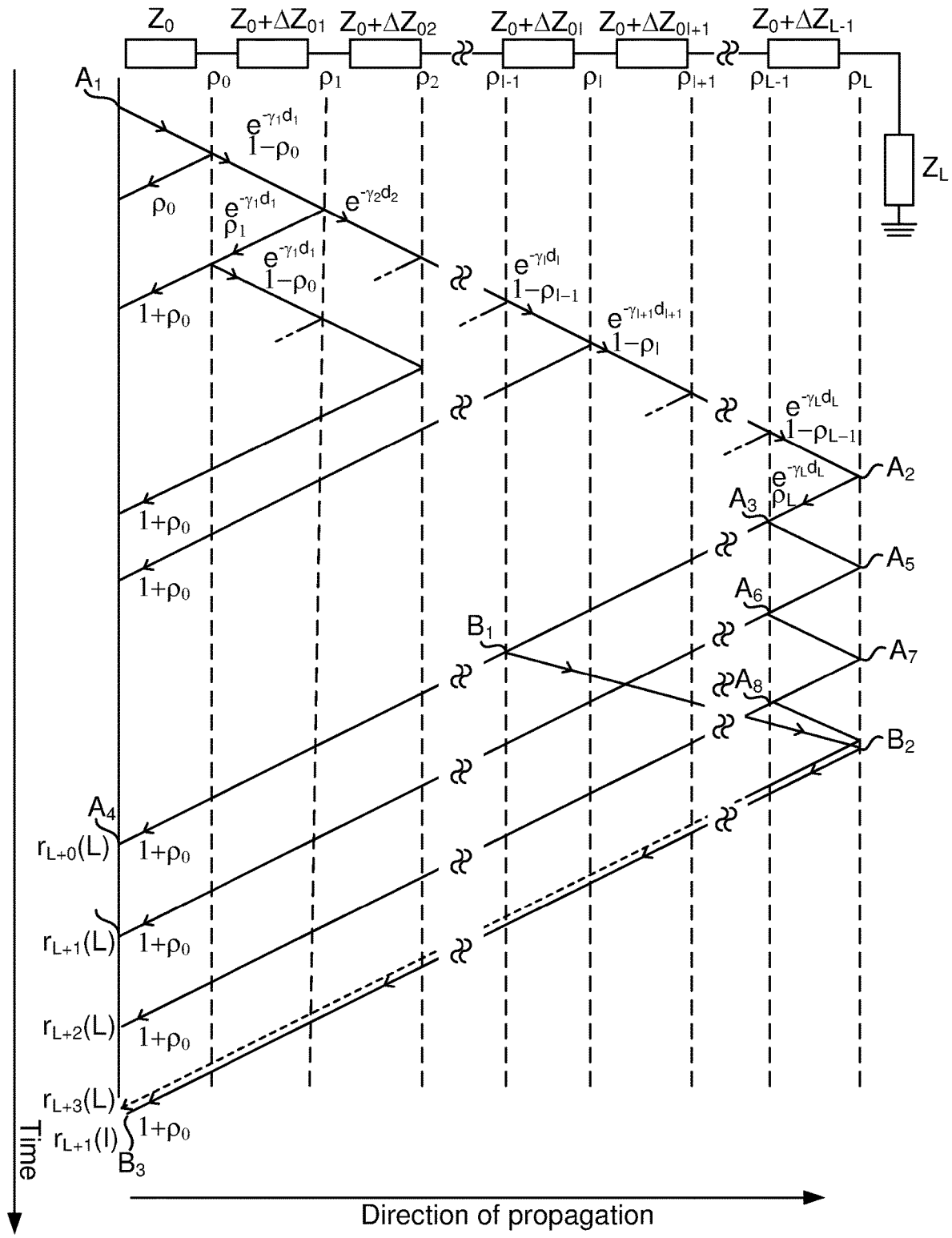
FIG. 3 illustrates a physical interpretation of reflected signals.

FIG. 3 illustrates a physical interpretation of the reflected signals according to the above mentioned model, which considers the electrically conducting line as an entity that reflects electromagnetic pulses. At point $A_1$, a wideband test signal is output S100 to the line. Changes in impedance $\Delta Z_0$ with respect to a characteristic impedance $Z_0$ of the line are represented by lumped elements upon which a portion of an incoming signal is reflected. A reflected contribution, r, is often the result of multiple internal reflections.

The $i^{th}$ contribution $r_i$, received S200 at the time $t_i$ can be expressed as follows:

$$r_i = \rho_i \cdot \prod_{k=0}^{i-1}(1-\rho_k^2) \cdot e^{-2\gamma_k d_k} \cdot \delta\left(t - 2 \cdot \sum_{k=o}^{i} \frac{d_i}{v_i}\right) \quad (1)$$

where $\rho$ represents the reflection coefficient, and $\gamma$, d, v, represent the propagation constant, length and velocity of propagation, respectively. $\delta$ is the Kronecker delta. Indices i and k represent the corresponding line segments. The contributions are superimposed to form S300 a trace of the reflections.

When the successive reflected contributions $r_i$'s are represented on a logarithmic graph, they appear as a noisy function that can be approximated as a straight line, the word "line" in the context of approximating functions being the mathematical concept of a line. See e.g. the line L of FIG. 8 for an illustration. This is under the assumption that the variation of the characteristic impedance, or equivalently—the propagation constant, is very small.

Hence:

$$\log(r_i) = \log(\rho_i) + \sum_{k=0}^{i-1} \log(1-\rho_k^2) - 2 \cdot \sum_{k=0}^{i-1} \gamma_k d_k \quad (2)$$

where the
 $3^{rd}$ term represents the accumulated attenuation at time instants $t_i$,
 $2^{nd}$ term represents losses due to back-transmission of the wave,
 $1^{st}$ term represents the reflection coefficient at time instant $t_i$.

The above formula holds within the roundtrip time, which is a time required for an electromagnetic wave to travel forth and back the line, proviso that the multiple reflections can be neglected.

For times longer than the roundtrip time $t_d$, $t_i > t_d$, only reflected contributions $r_i$ involving multiple reflections within a layer defined by two different impedances of the electrically conductive line can be observed.

Consider the part of the test signal entering at point $A_1$, the point $A_1$ representing both a point in the line, typically a termination point, as well as a point in time. It propagates through the line until it reaches the termination of the line at point $A_2$, here illustrated having multiple reflections along the way. At point A2, the signal is reflected and will propagate in the opposite direction in the line, until part of it has returned to its starting point in the line, but at a later time than $A_1$, represented by the point $A_4$. The path from points $A_1$ to $A_2$ to $A_4$ indicated in the bouncing diagram, whereas the signal is reflected at the line termination at $A_2$, depicts a major reflection having an amplitude that will stand out as an anomaly in the resulting trace of the reflections, cf. the peak at about 50 distance units in FIG. 2. Identifying S400 at least one anomaly in the trace of reflections enables the identification of a termination point of the line. Signals received after the time at point $A_4$ must be due to delays caused by reflections inside the line. Points $A_3$, As, $A_6$, $A_7$ and $A_8$ illustrate points where the signal is reflected at the boundaries L and L−1 between corresponding impedances $Z_L$ and $Z_0 + \Delta Z_{L-1}$ for boundary L and $Z_0 + \Delta Z_{L-1}$ and $Z_0 + \Delta Z_{L-2}$ for boundary L−1, resulting in received contributions after the time at point $A_4$. We adopt the notation $r_{L+k}(I)$ to denote the contribution from the k:th reflection in a layer I, where layer I is defined as the layer between boundary I and L, for k>0. The case k=0 would correspond to the case where no additional reflections have taken place, such as the reflection at $A_2$ which exits at $A_4$, which is here denoted $r_{L+0}(L)$. The reflections at points $A_3$, $A_5$, and $A_6$, and $A_6$, $A_7$ and $A_8$ thus result in contributions $r_{L+1}(L)$ and $r_{L+2}(L)$. Similarly, contributions from the k:th reflection in a layer I, one such contribution being exemplified by the path from points $B_1$ to $B_2$ to $B_3$, provide contributions $r_{L+k}(I)$. The reflected contributions before and after the point $A_4$ will depend on the type of line termination. Therefore, a step of determining S500 termination characteristics of the line based on characteristics of the trace before and after the identified at least one anomaly is included.

We adopt the term "reverberation", by which we understand the persistence of a signal caused by multiple reflections within a closed space, such as the multiple reflections between boundaries L and L−1, as well as L and I−1, as illustrated in FIG. 3. The magnitudes of the consecutive reflections decay with geometric progression. Therefore, higher order reverberations can be neglected even in the case when $|\rho_L| \approx 1$, as illustrated below, because the reflected signals are attenuated by at least a factor of $|\rho_i|$.

Reverberation in the consecutive layers can be expressed recursively as follows in layer L between impedances L and L−1

$$r_{L+k}(L) = r_L [-\rho_{L1} \cdot \rho_L \cdot e^{-2\gamma_L \cdot d_L}]^k \qquad (3)$$

in layer I between impedances L and I−1

$$r_{L+k}(I) = r_L [-\rho_{L-I-1} \cdot \rho_L \cdot \Pi_{k=L}^{L-I} e^{-2\gamma_k \cdot d_k}]^k \qquad (4)$$

The reflections coming after the last primary reflection from within the cable, $r_L$, are products of this last contribution and a factor proportional to $\rho_K \cdot \rho_L$, where K is an arbitrary layer, K=0 . . . L−1. Hence, if $|\rho_L| \approx 0$, which is equivalent to the case of characteristic termination, the (multiple) reflections are insignificantly small, i.e. negligible. Further, reflections from a deep layer moving directly backwards, i.e. first order, are the only internal reflections that are taken into account as the higher than first order reflections, i.e. k>1, involve a factor $[\rho_K]k$ irrespective of the reflecting layer. Referring again to (3) and (4) that when $|\rho_L| \approx 0$, and/or higher than first order, k>1, irrespective of value of $\rho_L$, all internally reflected signals coming after the last primary reflection $r_L$, compose a negligible contribution.

Hence the only considered reflections will be $$r_{L+k} = -r_L \cdot \rho_L \cdot \rho_{L-k-1} \cdot \prod_{m=1}^{k} e^{-2 \cdot \rho_{L-m} \cdot d_{L-m}} \cdot \delta\left(t - \left(t_d + \sum_{m=1}^{k} \frac{d_{L-m}}{v_{L-m}}\right)\right) \qquad (6)$$

which is an original sequence (1) in reverse order multiplied by a factor (with an "amplitude") $-r_L \cdot \rho_L$ and shifted by the roundtrip time $t_d$.

In other words, a random pattern of the TDR trace before an event, $p_{a.e.}$, and the random pattern after event, $p_{p.e.}$, exhibit scaled point symmetry around time instance $t_d$, provided proper de-trending (coordinate rotation) of the time domain trace based on the attenuation of the signal. In "spectral" time domain, this symmetry becomes a line symmetry with respect to a reflection point around time instance $t_d$. This will be further illustrated in relation to FIGS. 6-12.

FIG. 4 is a flowchart illustrating embodiments of method steps for determining termination characteristics of an electrically conductive line in a communication system. In FIG. 4, the meaning of determining S500 termination characteristics is further clarified. In addition to line termination type, e.g. characteristically terminated, open, short-circuited or followed by another line segment, the termination characteristics may comprise impedance change, joint quality and faults. In FIG. 4, embodiments relating to determining if the line is characteristically terminated will be examined in more detail, with embodiments relating to determining other types of line termination and other properties relating to the termination characteristics will be illustrated in more detail below, in relation other figures. For illustrative purposes, determining S500 termination characteristics of the line based on characteristics of the trace before and after the identified at least one anomaly is illustrated using the trace of time domain reflectometry, TDR, measurements, wherein the trace comprises a set of measured intra-segment reflections and each identified anomaly represents a reflection from a respective impedance discontinuity, the reflection having a magnitude defining a peak of the trace. According to an aspect, the test signal is a wideband test signal using a bandwidth of 400 MHz. According to an aspect, the method comprises determining S501 if a segment of the line is terminated with a lumped element based on a drop of the reflection magnitudes following the at least one anomaly. The drop of the reflection magnitudes following the at least one anomaly may be interpreted as having been "absorbed" by a lumped element. For instance, the signal continues to propagate in a second line segment after the at least one anomaly of different quality than the line segment before the at least one anomaly. Another example is a case where the line is terminated with an impedance matched entity, such as a remote radio head. According to a further aspect, determining S501 if a segment of the line is terminated with a lumped element comprises determining S502 the line segment as being characteristically terminated when the drop is larger than a predetermined threshold. If the line segment is characteristically terminated, no additional attenuation will be observed after the last reverberations have dissipated. The signal will appear as fully absorbed. This is seen in the trace as the reflection magnitudes being below the predetermined threshold after the drop. Typically, the trace following the drop manifests itself as a noise floor.

Figure 5:
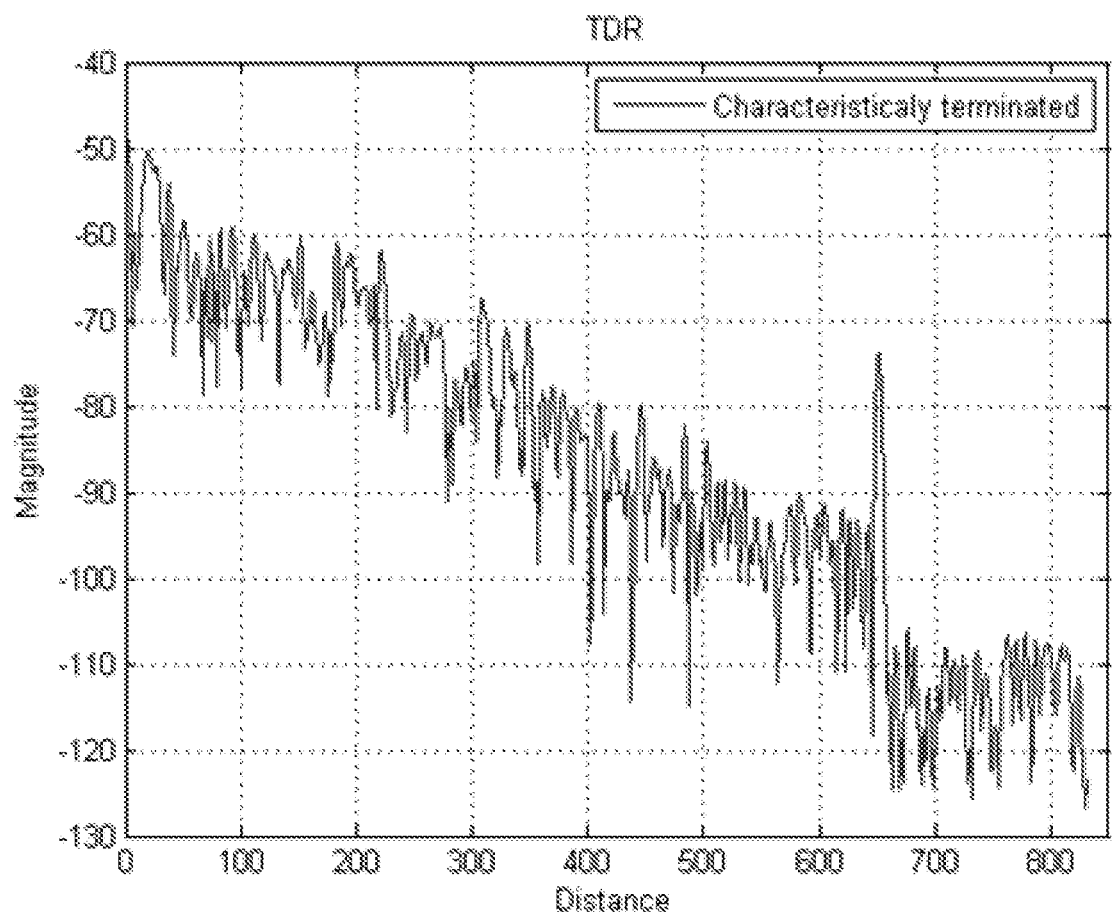
FIG. 5 illustrates experimental measurement data for a characteristically terminated line.

Experimental TDR measurement data for a characteristically terminated line is illustrated in FIG. 5. The at least one anomaly manifest itself as a distinct peak at about a distance of 650 distance units. There is a drop from about a magnitude of −100 dB before the peak to −115 dB after the peak. The reflection magnitudes following the drop are below a predetermined threshold; the predetermined threshold is not illustrated. The trace following the drop below the predetermined threshold manifests itself as a noise floor. The combination of $|\rho_L| \approx 0$ and that all reflected signals coming after the last primary reflection $r_L$, wherein the last primary reflection $r_L$ is represented by the peak at distance 650 in FIG. 5, when $|\rho_L| \approx 0$, and/or of higher than first order, k>1, irrespective of value of $\rho_L$, compose a negligible contribution, enables determining the line segment as being characteristically terminated.

Returning to FIG. 4, further embodiments are possible, which capture other aspects of determining termination characteristics. According to an aspect, determining S500 termination characteristics of the line based on characteristics of the trace before and after the identified at least one anomaly comprises determining S503 correlation characteristics of the reflections before and after the at least one anomaly. Every line is unique and has a unique distribution of impedance discontinuities. A test signal that is reflected at an open termination is expected to first pass a set of unique impedance discontinuities on its way towards the open termination and then pass the same set of unique impedance discontinuities in reverse order after being reflected. While the scattering amplitudes of the test signal when passing the impedance discontinuities may differ before and after the reflection event at the open termination, the spatial distribution of their contributions to the trace is expected to show reflection symmetry about the reflection event at the open termination. In theory there will be a very small correlation since one path will reflect back through the impedance discontinuities of line 1. This would however most likely drown in other contributions and the correlation would not be measurable. Thus, in practice a first line segment followed by another line segment will not be expected to show any correlation of the trace before and after a reflection at the termination between the two line segments, due to the two line segments having respective unique impedance discontinuity distributions. According to a further aspect, determining S500 termination characteristics of the line based on characteristics of the trace before and after the identified at least one anomaly comprises determining S504 if a first segment of the line has an open termination, is short-circuited or is followed by a second segment of the line based on the correlation characteristics. By examining the TDR trace based on the proposed model, reflection symmetry characteristics of the TDR trace can be used to distinguish between a line termination that is either open, short circuited or followed by another line segment. Embodiments relating to these aspects will be illustrated below in relation to FIGS. 6-13.

In addition to line termination type, properties of the line termination, such as the associated impedance, may be of interest. According to an aspect, determining S500 termination characteristics of the line based on characteristics of the trace before and after the identified at least one anomaly comprises determining S510 impedance change at the at least one anomaly based on the magnitude of the reflection represented by the at least one anomaly. The general form of the reflection coefficient ρ when moving from a first medium having impedance $Z_1$ to a second medium having impedance $Z_2$ is given by $$\rho = \frac{z_2 - z_1}{z_2 + z_1}. \quad (6)$$

By determining the magnitude of the reflection |ρ|, it is possible to estimate the impedance change.

Embodiments relating to this aspect will be illustrated below in relation to FIGS. 13-16.

Figure 7:
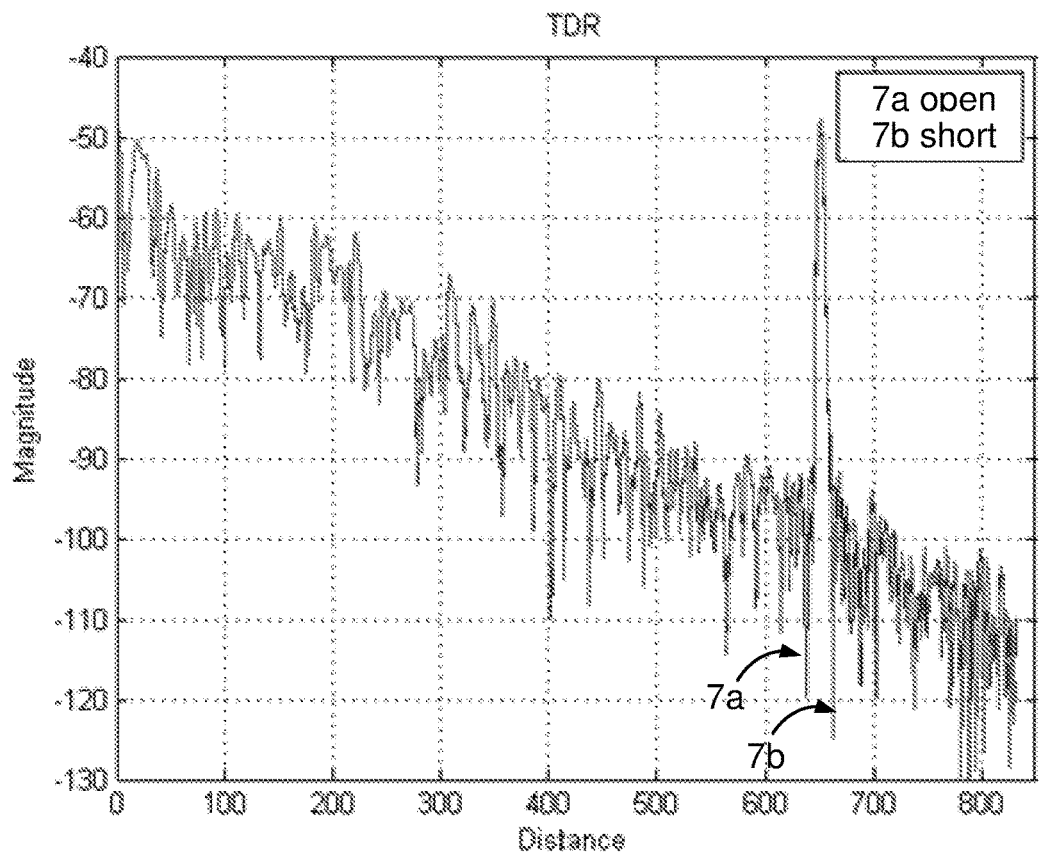
FIG. 7 illustrates experimental measurement data for an open termination and a short circuit termination.
Figure 8:
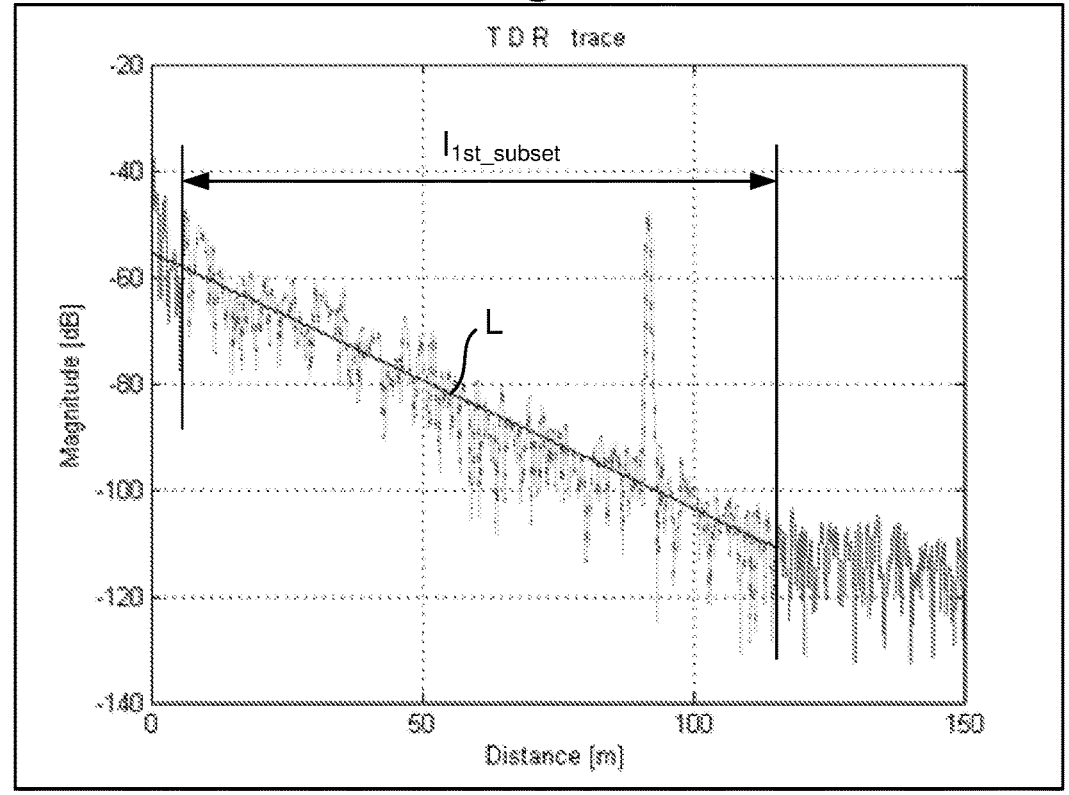
FIG. 8 illustrates a selected first subset of a trace.
Figure 9:
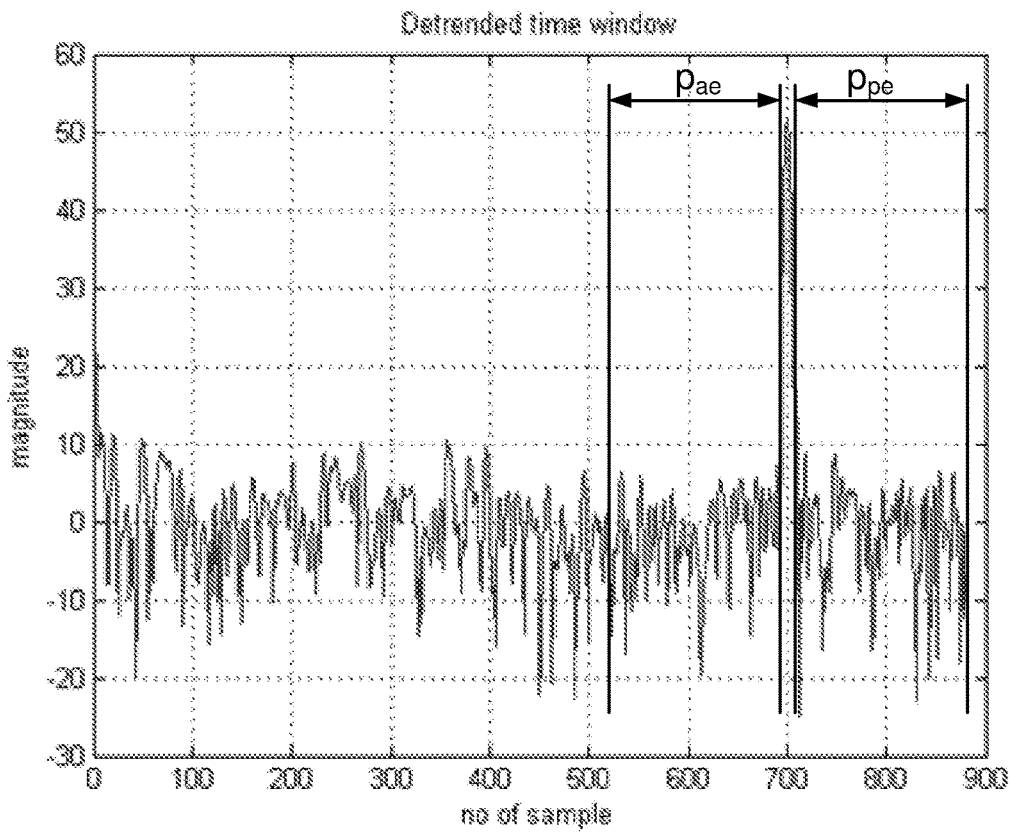
FIG. 9 illustrates an aspect of a determined second subset as well as third, $p_{ae}$, and fourth, $p_{pe}$, subsets.
Figure 10:
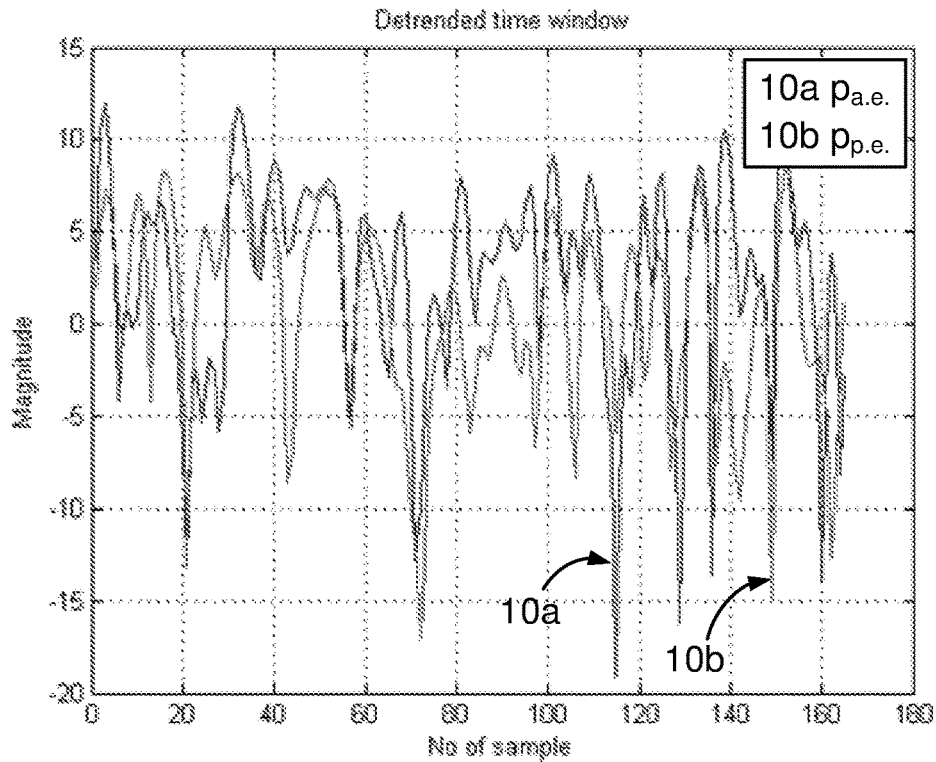
FIG. 10 illustrates the subsets $p_{ae}$ (third subset) and $p_{pe}$ (fourth subset) of FIG. 9, with $p_{pe}$ being in reverse order.
Figure 11:
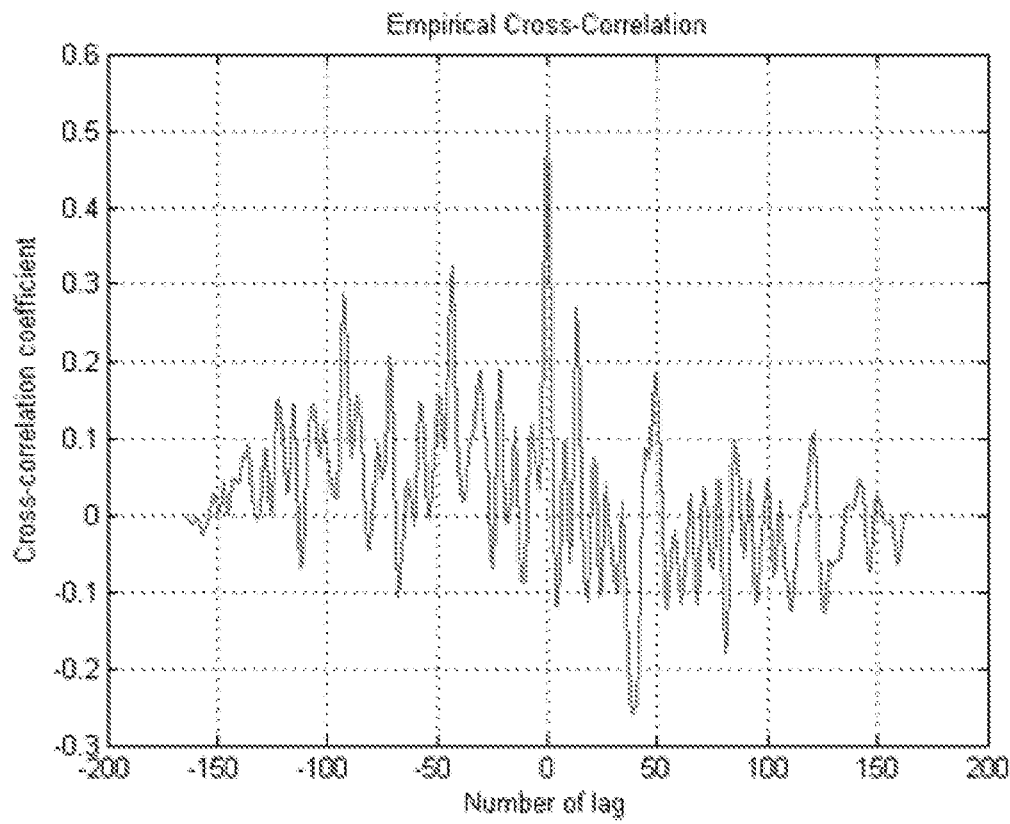
FIG. 11 illustrates the resulting correlation characteristics of the two subsets of FIG. 10.
Figure 12:
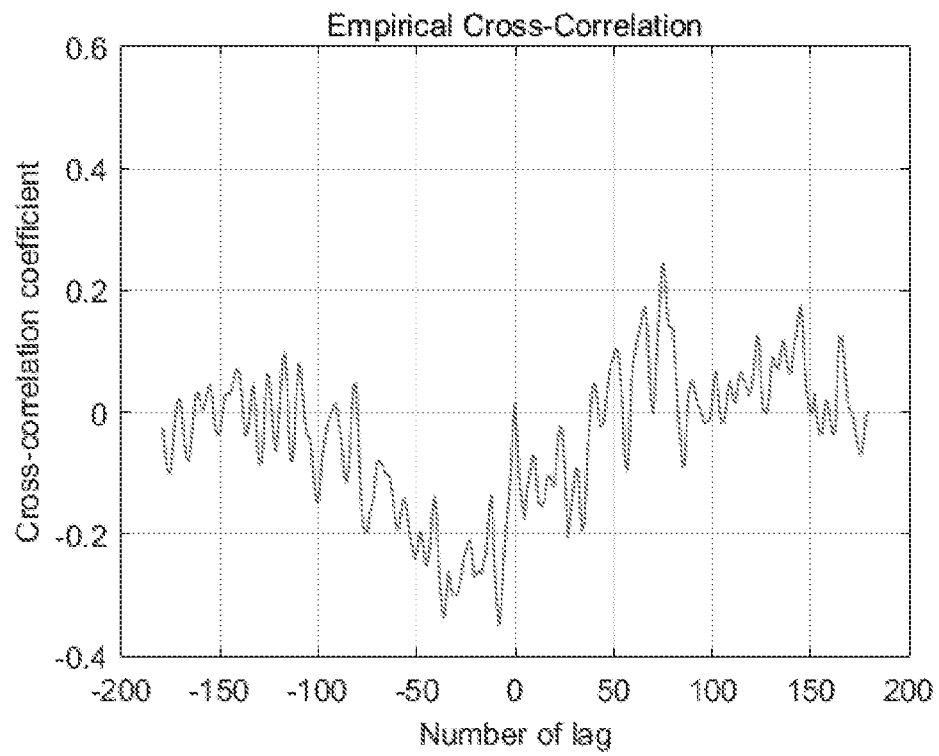
FIG. 12 illustrates the correlation characteristics for a first line segment followed by a second line segment.

FIG. 6 illustrates aspects of determining S503 correlation characteristics of the reflections before and after the at least one anomaly. Experimental TDR data for a line having either an open termination or is short circuited is illustrated in FIG. 7. FIGS. 8-11 illustrate the different aspects of FIG. 6 using the experimental TDR data of FIG. 7. FIG. 8 illustrates selecting S506 a first subset of the trace, wherein the first subset comprises the at least one anomaly. FIG. 9 illustrates a determined S507 second subset based on the first subset adjusted for attenuation. FIG. 10 illustrates determined S508 third and fourth subsets from the second subset, wherein the third and fourth subset comprises subsets of the adjusted trace before and after the at least one anomaly, respectively. FIG. 11 illustrates determining S509 a correlation coefficient based on the third and fourth subsets. Finally, FIG. 12 is used to demonstrate how the case of a second line segment following the examined line segment is distinguished from an open or short circuited termination.

Turning to FIG. 6, according to an aspect, determining S503 correlation characteristics of the reflections before and after the at least one anomaly comprises determining S505 reflection symmetry characteristics of the reflections before and after the at least one anomaly. Since no two line segments have exactly identical impedance discontinuity distributions, comparing the trace before a major reflection at a line segment termination point to the trace after the major reflection can provide information on the line termination characteristics. If the line segment has an open termination, the test signal will be reflected at the end of the line segment and travel backwards towards its origin. The test signal will thus pass the vicinity of the open termination twice, once approaching the open termination and once after having been reflected. Since the test signal propagates over the same impedance distribution, the second time in a reverse order, the trace will exhibit reflection symmetry about the major reflection at the open termination. If the line segment is characteristically terminated or is followed by another line segment, the impedance distribution will differ before and after a major reflection at the line segment termination point. By determining S505 reflection symmetry characteristics of the reflections before and after the at least one anomaly, it is possible to distinguish between different types of line terminations.

Turning to FIG. 7, which illustrates experimental TDR measurement data for a line having either an open termination 7a or is short circuited 7b, an embodiment comprising the aspects of FIG. 6 will now be described. Determining S505 reflection symmetry characteristics of the reflections before and after the at least one anomaly comprises selecting S506 a first subset of the trace, wherein the first subset comprises the at least one anomaly. The first subset of the trace is the basis for determining S505 reflection symmetry characteristics of the reflections before and after the at least one anomaly.

FIG. 8 illustrates a selected first subset of the trace comprising the at least one anomaly in the form of a peak in the TDR trace at about 85 m. The first subset comprises the TDR trace within the illustrated interval $I_{1st\_subset}$. According to an aspect, the first subset is determined such that transients due to the first reflection are minimized. The influence of transients can be reduced be ignoring measurement data within a predetermined region about the peak in the TDR trace. Aspects of reducing the influence of transients will be described in greater detail below. By reducing the influence of transients, the accuracy of subsequent adjusting for attenuation can be improved, since the accuracy of a straight line fitting to the TDR trace is improved. Further advantages will be described below in relation to FIG. 14. When the last reflections from the test signal have died out, the only received signals are due to noise. After the interval $I_{1st\_subset}$ in FIG. 8, the last reflections from the test signal have died out and the remaining trace reflects the noise floor. According to a further aspect, the first subset is determined such that the influence of the noise floor is limited. This is seen in FIG. 8 in that the first subset is determined such that it includes as little of the noise floor as possible. By limiting the influence of the noise floor, the accuracy of subsequent adjusting for attenuation can be improved, since the accuracy of a straight line fitting to the TDR trace is improved. A second subset is then determined S507 based on the first subset adjusted for attenuation. According to an aspect, the adjustment for attenuation comprises fitting a straight line, denoted L in FIG. 8, to the first subset. According to a further aspect, the straight line is fitted using a least squares method. According to an aspect, measurement data relating to the peak is determined and removed from set on which the straight line fitting is based. By removing the influence of the extreme values of the peak on the line fitting, the accuracy of the trend is improved. Once the straight line is determined, the measured data of the first set can be adjusted for attenuation based on the straight line. According to an aspect, the second set is formed based on a subtraction, in a logarithmic scale, of differences between the line values and the measured data of the first set from the measured data of the first set. According to an aspect, the second set is formed based on a division, in a linear scale, of differences between the line values and the measured data of the first set from the measured data of the first set. According to an aspect, the adjustment for attenuation comprises a coordinate transformation.

FIG. 9 illustrates an aspect of a determined S507 second subset. The trend associated with the attenuation has been removed due to adjusting the measured data with the fitted line. A coordinate transformation has shifted the adjusted data of the second set to a reference level of 0 dB. According to a further aspect, a third and a fourth subset are determined S508 from the second subset, the third and fourth subset comprising subsets of the adjusted trace before and after the at least one anomaly, respectively.

FIG. 9 further illustrates an embodiment of determining S508 the third and fourth subset. A pair of subsets having matching sizes is determined about the peak, corresponding to the third subset, denoted $p_{ae}$, and the fourth subset, denoted $p_{pe}$, respectively. According to an aspect, determining S503 correlation characteristics comprises determining S509 a correlation coefficient based on the third and fourth subset. According to a further aspect, the correlation coefficient is defined to show no correlation between the third subset and a reverse order of the fourth subset at the at least one anomaly if the first segment is followed by a second segment and also defined to show a correlation between the third subset and a reverse order of the fourth subset at the at least one anomaly if the first segment is terminated with an open end or is short circuited. An aspect defining the correlation coefficient to meet these criteria is illustrated below. After the aspect defining the correlation coefficient has been described, FIG. 10 will illustrate an example of a third subset 10a and a reverse order fourth subset 10b, which, when examined for correlation based on the defined correlation coefficient, shows a correlation between the third subset 10a and a reverse order of the fourth subset 10b at the at least one anomaly if the first segment is terminated with an open end or is short circuited, FIG. 11, or shows no correlation between the third subset and a reverse order of the fourth subset at the at least one anomaly if the first segment is followed by a second segment, FIG. 12.

According to an aspect, the correlation coefficient, R, between the random pattern $p_{a.e.}$ of the TDR trace before the main reflection ("ante event") and the random pattern $p_{p.e.}$ of the TDR trace after the main reflection ("post event") as a measure of dependence between these two signals is defined as $$R = \frac{E[(p_{a.e.} - \mu_{a.e.})(p_{p.e.} - \mu_{p.e.})]}{\sigma_{a.e.}\sigma_{p.e.}} \quad (7)$$

where $\mu_{a.e.}$, $\sigma_{a.e.}$ and $\mu_{p.e.}$, $\sigma_{p.e.}$ denote mean and standard deviation of the random patterns observed before and after line end, respectively.

In particular $p_{p.e.} = -r_L \cdot \rho_L \cdot p_{a.e.}$ and consequently $\sigma_{p.e.} = r_L \cdot \rho_L \cdot \sigma_{a.e.}$.

The patterns are inevitably accompanied by additive noise. According to an aspect, it is assumed that the noise is uncorrelated in space-time domain with the patterns generated before and after the reflecting event. According to a further aspect, it is also assumed that the noise is white and Gaussian. According to a yet further aspect, this additive noise is assumed to have zero mean and standard deviation c. With these assumptions, the correlation coefficient is given by $$R = \frac{r_L \rho_L \sigma_{p_{a.e.}}^2}{\sqrt{(\sigma_{p_{a.e.}}^2 + \sigma_{noise}^2)(r_L^2 \rho_L^2 \sigma_{p_{a.e.}}^2 + \sigma_{noise}^2)}} \quad (8)$$

In the case of an open/short circuited end of the line, i.e. $|\rho_L| \approx 1$ (full reflection is equivalent to $|\rho_L|=1$), the correlation coefficient can be approximated $$R \approx 1 - \frac{1}{2}\frac{\sigma_{noise}^2}{\sigma_{p_{a.e.}}^2}\left(\frac{1+r_L^2\rho_L^2}{r_L^2\rho_L^2}\right) \approx 1 - \frac{1}{2}\frac{\sigma_{noise}^2}{\sigma_{p_{a.e.}}^2}\left(\frac{1+r_L^2}{r_L^2}\right) < 1 \quad (9)$$

Cable attenuation and noise that accompany the TDR trace impose fundamental limitations on the statistical quality of the measure of dependence.

FIG. 10 illustrates the two subsets $p_{ae}$ and $p_{pe}$ of FIG. 9, with $p_{pe}$ being in reverse order.

Defining the correlation constant according to equation (8) or (9) above and determining the correlation between the subsets of FIG. 10, the resulting correlation characteristics are illustrated in FIG. 11. There is a clear correlation around the 0-lag point, indicating that the reflections immediately after the main reflection at the end of the line experience the same scattering environment as just before arriving at the end of the line, i.e. the reflected signals repeat the reflection pattern in a backward order. Based on the above model, this can be interpreted as the full reflection, $|\rho_L|\approx 1$, of an open or short circuited end.

If the end of the line were followed by another line segment, the scattering environment would be different immediately before and after the reflection at the end of the line, since no two lines are identical. In such case, the correlation coefficient as defined above would not show any correlation at the vicinity of the main reflection between the corresponding TDR trace patterns $p_{ae}$ and $p_{pe}$, as is illustrated in FIG. 12 based on experimental TDR measurement data for a first line segment being followed by a second line segment.

According to an aspect, determining S503 correlation characteristics of the reflections before and after the at least one anomaly comprises ignoring reflection magnitudes of the reflections from impedance discontinuities before and after the at least one anomaly within a guard zone of the at least one anomaly, in order to reduce the influence of transients on the determination of the correlation characteristics.

Figure 13:
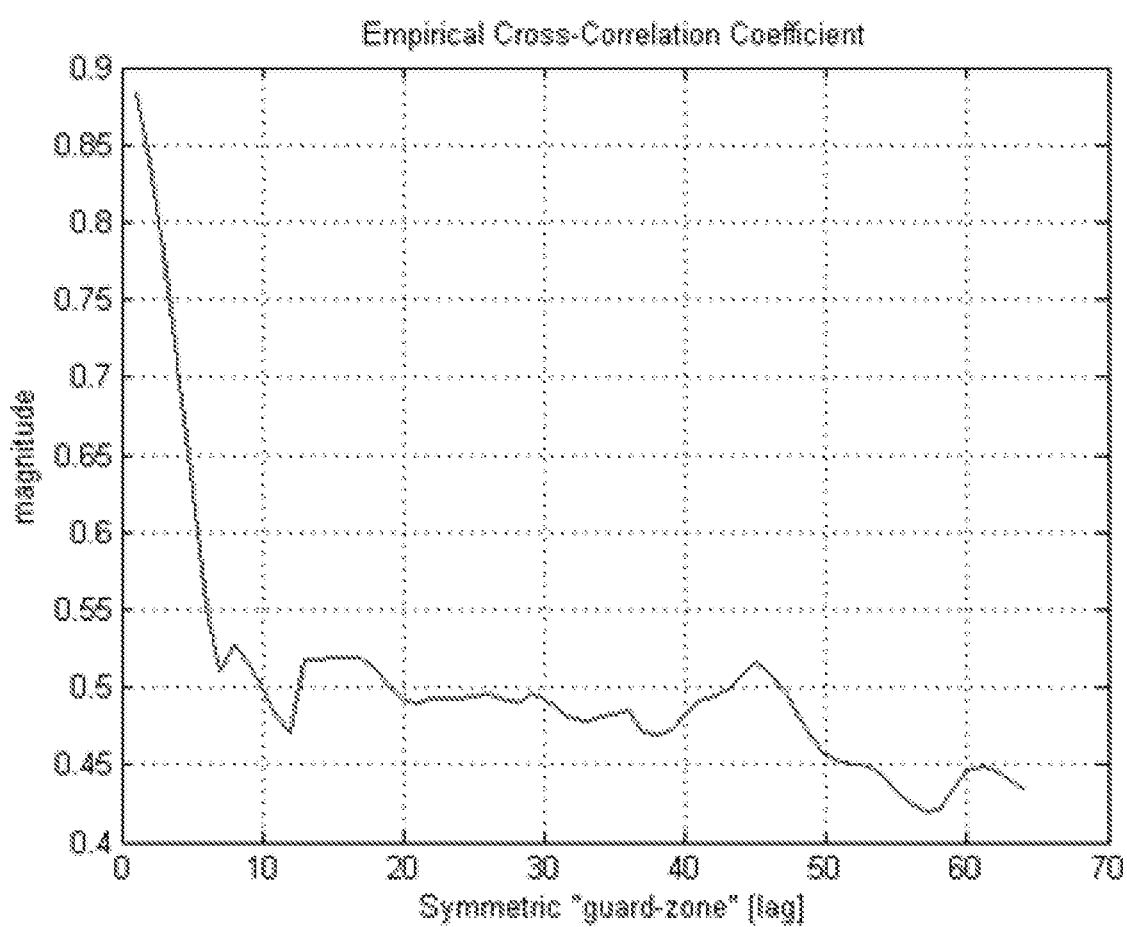
FIG. 13 illustrates a symmetric "guard-zone" before and after a main reflection event.

FIG. 13 illustrates the introduction of a symmetric "guard-zone" before and after the main reflection event at 0 lag points to remove the influence of transients on the determination of the correlation characteristics, illustrated in e.g. FIGS. 11-12, due to reflection from a "large" impedance discontinuity. For a "guard-zone" larger than about 10 lag points, the cross-correlation coefficient is steady until about 45-50 lags, after which the deteriorating effect of a worsening signal-to-noise ratio becomes noticeable.

As has been mentioned above, determining termination characteristics may comprise more than determining line termination type. According to an aspect, determining S500 termination characteristics comprises determining S510 impedance change at the at least one anomaly based on the magnitude of the reflection represented by the at least one anomaly. FIG. 14 illustrates aspects relating to determining S510 impedance change at the at least one anomaly. Embodiments relating to the aspect illustrated in FIG. 14 will be described in detail below, with the aid of FIGS. 15 and 16.

The magnitude of the reflection coefficients at a time/space instance measured at the input of the transmission line can be determined using a model of attenuation to describe the reflection coefficient along the transmission line. At the input one gets $$\rho_0 = \rho_L * e^{-2\gamma d} \quad (10)$$

where all terms have been defined above. Without loss of generality, focusing on the magnitude signal means that the propagation constant $\gamma$ can be substituted by an attenuation factor $\alpha$, viz., $$\rho_0 = \rho_L * e^{-2\alpha d} \quad (11)$$

According to an aspect, determining S510 impedance change comprises using S511 a linear model approximation of the reflected signal power loss due to attenuation.

Taking the logarithm of both sides of eq. (12) one obtains $$20*\log(\rho_0) = 20*\log(\rho_L) + 20*\log(e^{-2\alpha d}) \quad (12)$$

The measured amplitude of the reflected wave at the input is a function of the maximum of the reflected signal, h, and the signal power loss due to line attenuation (b−c), $$\rho_L = 10^{(h+(b-c))/20} \quad (13)$$

where h is the reflection magnitude, b is the intercept of a fitted straight line and c is the ordinate of this straight line corresponding to the abscissa of the reflection. All those values are stated in decibels.

Figure 15:
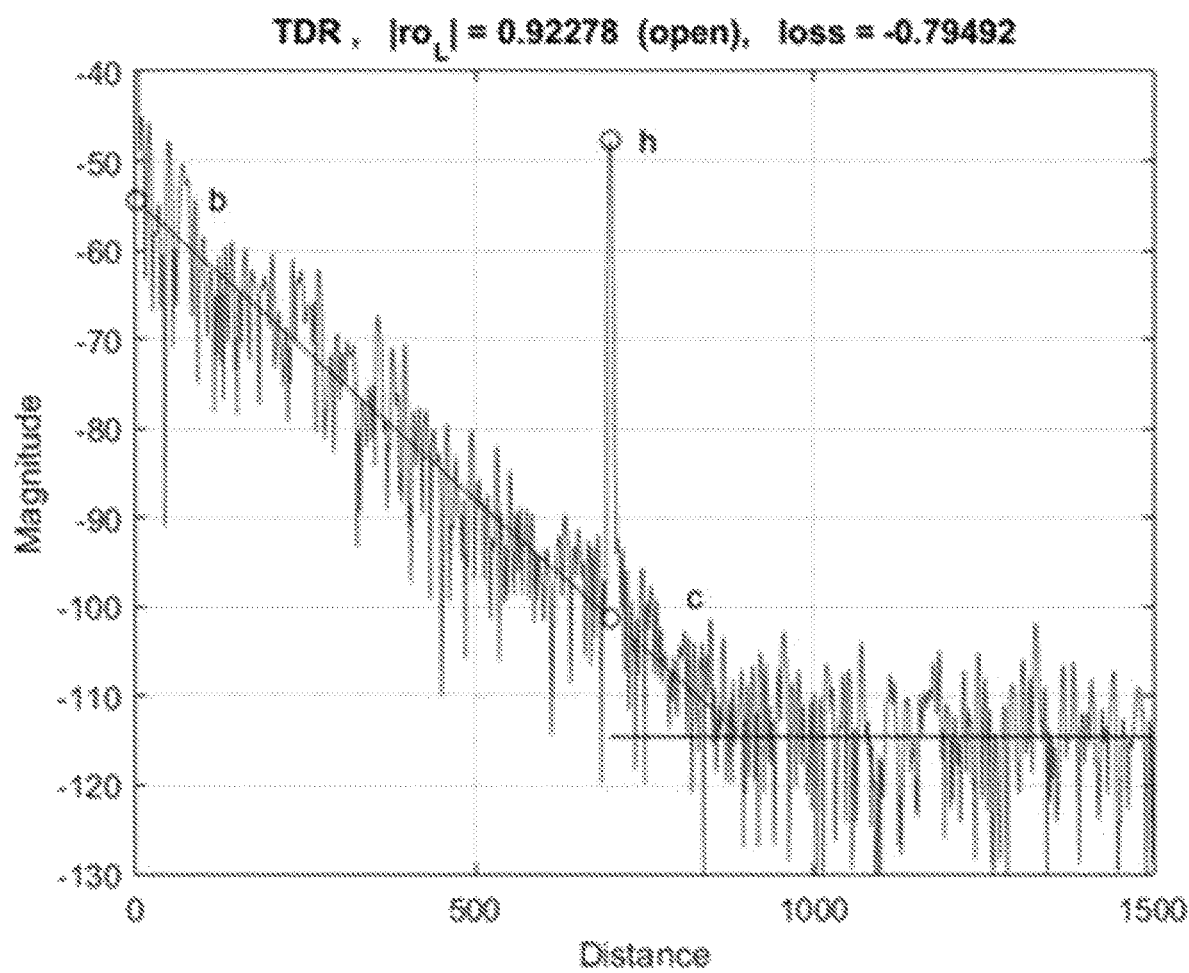
FIG. 15 illustrates experimental Time Domain Reflectometry measurement data for an open line termination.
Figure 16:
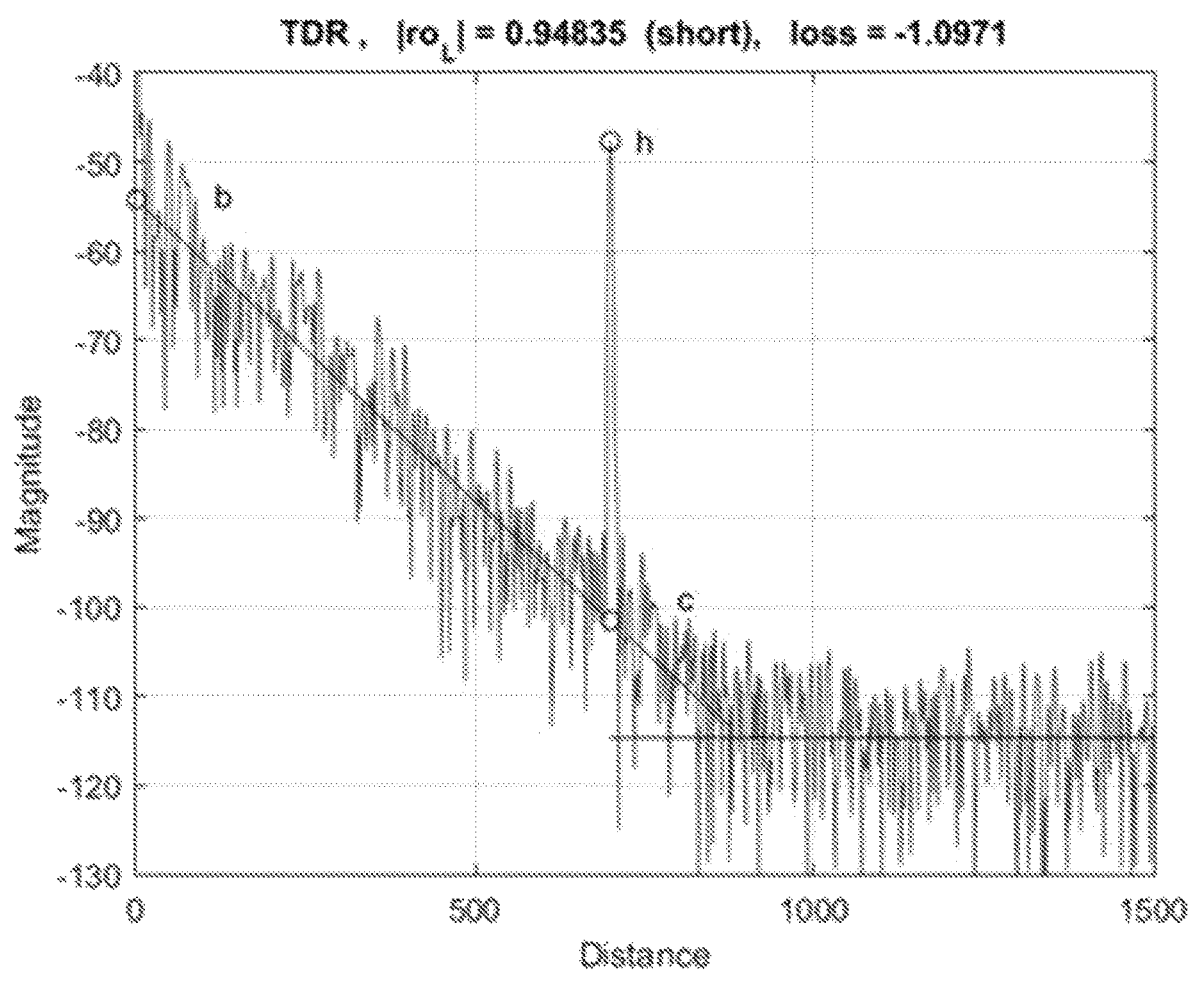
FIG. 16 illustrates experimental Time Domain Reflectometry measurement data for a short circuit line termination.

FIGS. 15 and 16 illustrate experimental TDR measurement data for an open and short circuit line termination, respectively. Based on the measurements illustrated in FIGS. 15 and 16, the variables h, b and c are determined for the respective line terminations. The determined variables are then used to calculate a coarse magnitude of the reflection coefficient, which in the cases illustrated in FIGS. 15 and 16 become $|\rho_L=0.92278|$ for an open line and $|\rho_L=0.94835|$ for a short-circuited line, respectively.

According to an aspect, determining S510 impedance change comprises ignoring S513 reflection magnitudes of the reflections from impedance discontinuities before and after the at least one anomaly within a guard zone of the at least one anomaly, in order to reduce the influence of transients on the determination of the impedance change. The accuracy of the determination of the variables b and c above depends on the accuracy of the line fitting. Since the maximum that determines h (the peak) will have a negative influence on the line fitting, it is desirable to eliminate its influence on the line fitting. The guard zone concept that was illustrated in FIG. 13 can also be used to determine which measurement data relating to the peak that is appropriate to discard when determining the b and c variables.

According to an aspect, determining S510 impedance change comprises applying S512 a correction factor based on a model of forth to back transmission losses of the magnitude of the reflection represented by the at least one anomaly.

Eq. (2) implies that a value at the top was further reduced by forth to back-transmission losses relating to a factor $(1-\rho_k^2)$. This phenomenon is hardly noticeable and is usually omitted as its influence on the measurement accuracy on e.g. an attenuation constant $\alpha$, is negligible in comparison to factors such as background noise.

However, forth to back-transmission losses are an accumulative phenomenon, $$\sum_{k=0}^{i-1} \log(1-\rho_k^2).$$

Therefore the accuracy of determining the reflection coefficient can be improved by adding (in a logarithmic scale) a correction factor, $g_{tl}$, such that $$\widehat{\rho_L} = -g_{tl} + 10^{(h+(b-c))/20} \quad (14)$$

where the correction factor $g_{tl}$ can be determined heuristically. According to an aspect, the correction factor $g_{tl}$ is introduced by the following sequence of arithmetical operations temp1=20*log(r(d))−2·α·d temp2=10$^{temp1}$ temp3=1−temp2$^2$ $$g_{tl} = 20*\log(temp3) = 20*-\log(temp3) \quad (15)$$

The calculations so far have been based on the assumption that each point in the measured time domain reflectogram corresponds to an actual reflection coefficient at this point.

Even though this might be a good approximation, it is theoretically not entirely true because factors such as dispersion and limited measurement bandwidth, among other possible factors. The introduction of the empirical correction factor, $g_{tl}$ considerably improves the estimate of the reflection coefficient. Applying the correction factor on the previously considered example, one gets $|\rho_L|=0.96286$ for an open line, an improvement from 0.92278. For a short-circuited line, the respective reflection coefficient is $|\rho_L|=0.98974$, an improvement from 0.94835.

An advantage with the disclosed method is that all variables in the above formula are measurement values and not nominal or cable model values. Therefore, the result is better anchored in reality since nominal values fluctuate. It is not necessary to use previously calculated or estimated properties or values while determining actual ones. The risk for error propagation and/or error accumulation is therefore eliminated, which improves accuracy further.

Figure 17:
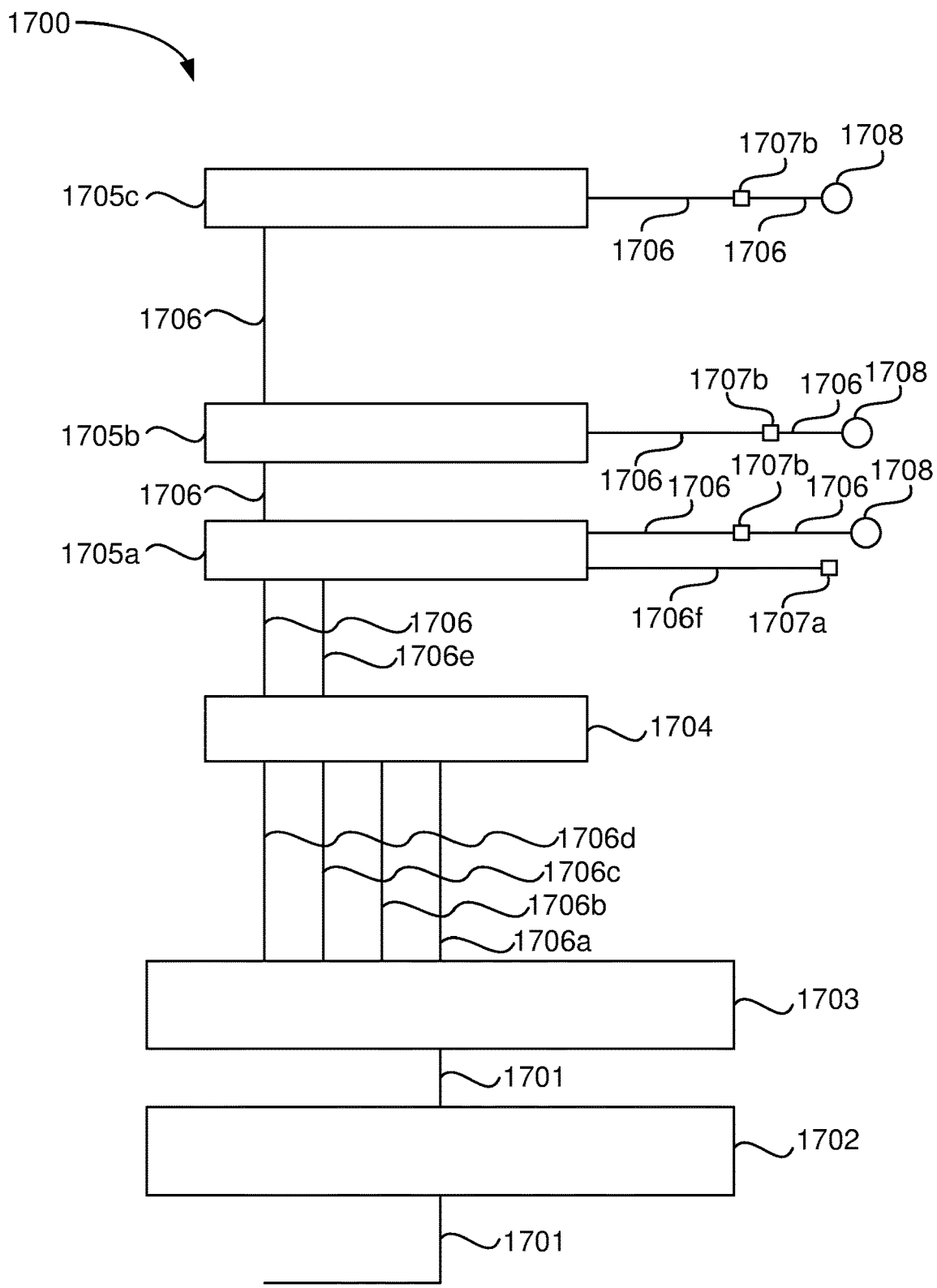
FIG. 17 illustrates a communication system comprising electrically conductive lines where the disclosed method is advantageously used.

FIG. 17 illustrates a communication system 1700 comprising electrically conductive lines 1706, 1706a-f. The communication system 1700 illustrates a remote radio head system, and represents a typical example in which the proposed method is used. Digital signals enter the system via a cable 1701 and into a Digital Unit, DU 1702. The DU 1702 transmits the signals to a radio unit, RU 1703. The RU 1703 acts as a switch, outputting signals on electrically conducting cables 1706a-f of Category 5 or higher. The RU 1703 outputs signals along parallel lines, each line comprising serially connected line segments 1706, 1706a-d, wherein the line segments 1706, 1706a-f pass patch panels 1704, 1705a-c until the final line segment is either characteristically terminated by a remote radio head 1708 or has an open termination 1707a. The wideband test signals outputted according to the proposed method are typically outputted on the four line segments 1706a-f from the RU 1703. The test signals then propagate through the line segments 1706, 1706a-f and patch panels 1704, 1705a-c until they reach the final line segment termination, where they are typically either absorbed due to a characteristic termination or reflected due to an open termination. According to an aspect, the RU 1703 comprises a line estimation device according to claim 13. According to an aspect, the test signals are outputted by a separate line estimation device according to claim 13. According to an aspect, a test signal outputted on line segment 1706a will propagate to the open termination 1707a via a first patch panel 1704, a second line segment 1706e, a second patch panel 1705a and a third line segment 1706f. According to an aspect, the open termination comprises a socket arranged to receive a plug of a cable of a remote radio head. The proposed method then enables the detection of poorly or improperly connected remote radio heads, which may present itself as an open termination of the socket, depending on circumstances. Test signals on the line segments 1706b-d will propagate to the corresponding connected remote radio heads 1708 at the end of each corresponding line segment 1706, which will appear as characteristic terminations. Each of the patch panels 1704, 1705a-c and sockets 1707b that the test signals pass will appear as anomalies in the trace. For embodiments based on time domain reflectometry, TDR, the anomalies will appear as sharp peaks in the TDR trace.

Figure 18:
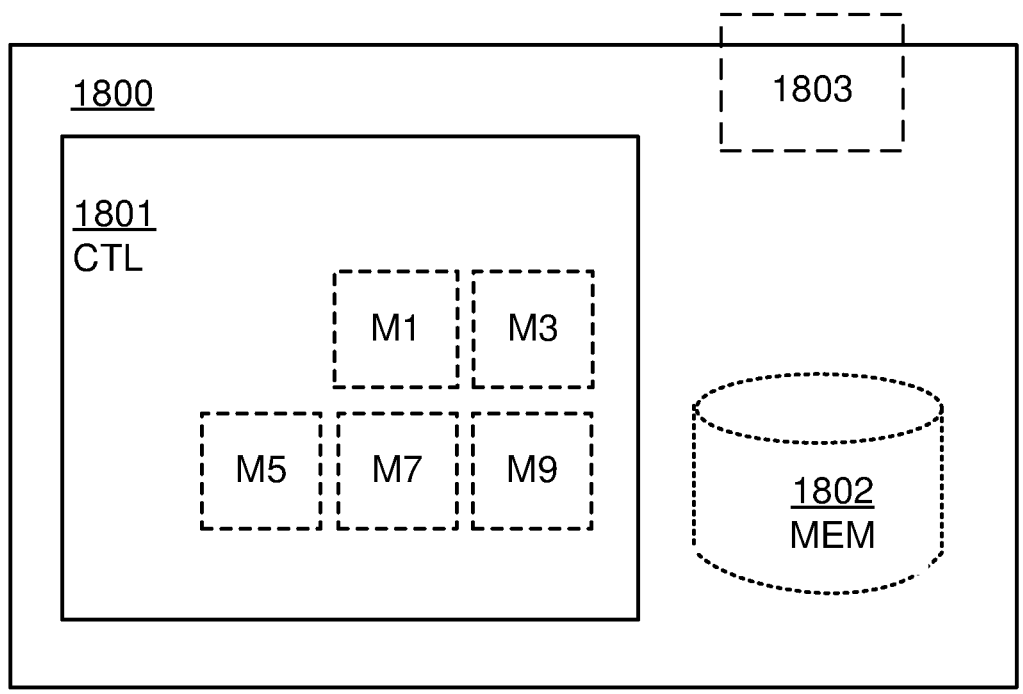
FIG. 18 illustrates embodiments of a line estimation device arranged to determine termination characteristics of an electrically conductive line in a communication system.

FIG. 18 illustrates embodiments of a line estimation device 1800 arranged to determine termination characteristics of an electrically conductive line in a communication system. The line estimation device 1800 comprises processing circuitry 1801. The processing circuitry 1801 is configured to output a test signal to the line, wherein the test signal is a wideband test signal with a bandwidth arranged to provide an adequate measurement time-resolution. The processing circuitry 1801 is further configured to receive reflections from impedance discontinuities of the line in response to the test signal. The processing circuitry 1801 is also configured to form a trace of the reflections. The processing circuitry 1801 is additionally configured to identify at least one anomaly in the trace of reflections. The processing circuitry 1801 is yet further configured to determine termination characteristics of the line based on characteristics of the trace before and after the identified at least one anomaly.

According to an aspect, the line estimation device 1800 further comprises a test port 1803 having known impedance, and the line estimation device 1800 is further adapted to output the test signal to the line via the test port 1803.

The processing circuitry 1801 may be any suitable type of computation unit, e.g. a microprocessor, digital signal processor, DSP, field programmable gate array, FPGA, or application specific integrated circuit, ASIC, or any other form of circuitry. It should be appreciated that the processing circuitry 1801 need not be provided as a single unit but may be provided as any number of units or circuitry. According to an aspect, the processing circuitry 1801 is in communication, directly or indirectly, with an external communication interface (not shown). According to an aspect, the processing circuitry 1801 is capable of executing computer program code. According to an aspect, the line estimation device 1800 comprises a memory, MEM 1802. According to a further aspect, the memory 1802 is comprised in the processing circuitry 1801. According to an aspect, a computer program is stored in the memory 1802. According to a further aspect, the computer program, when run in the line estimation device 1800, causes the line estimation device 1800 to perform aspects of the method as disclosed above. According to some aspects, the memory 1802 is any combination of a Random Access Memory, RAM, and a Read Only Memory, ROM. According to an aspect, the memory 1802 comprises persistent storage, which, for example, can be any single one or combination of magnetic memory, optical memory, or solid state memory or even remotely mounted memory. According to some aspects the processing circuitry 1801 comprises modules configured to perform the methods described above. Hence, according to an aspect, the processing circuitry 1801 comprises an outputting module M1 configured to output a test signal to the line, wherein the test signal is a wideband test signal with a bandwidth arranged to provide an adequate measurement time-resolution. According to an aspect, the processing circuitry 1801 further comprises a receiving module M3 configured to receive reflections from impedance discontinuities of the line in response to the test signal. According to an aspect, the processing circuitry 1801 also comprises a forming module M5 configured to form a trace of the reflections. According to an aspect, the processing circuitry 1801 additionally comprises an identifying module M7 configured to identify at least one anomaly in the trace of reflections. According to an aspect, the processing circuitry 1801 yet further comprises a determining module M9 configured to determine termination characteristics of the line based on characteristics of the trace before and after the identified at least one anomaly.

The present disclosure also relates to a computer program comprising computer program code which, when executed in a line estimation device causes the line estimation device to execute a method according to any of claims 1-12.

The invention claimed is:

1. A method in a line estimation device for determining termination characteristics of an electrically conductive line in a communication system, the method comprising:
   outputting a test signal to the line, wherein the test signal is a wideband test signal with a bandwidth arranged to provide an adequate measurement time-resolution,
   receiving reflections from impedance discontinuities of the line in response to the test signal,
   forming a trace of the reflections,
   identifying at least one anomaly in the trace of reflections, and
   determining termination characteristics of the line based on characteristics of the trace before and after the identified at least one anomaly, wherein determining termination characteristics of the line further comprises determining a type of line termination, and wherein determining termination characteristics further comprises determining if a segment of the line is terminated with a lumped element based on a drop of the reflection magnitudes following the at least one anomaly.

2. The method according to claim 1, wherein the trace comprises a set of measured intra-segment reflections.

3. The method according to claim 1, wherein determining if a segment of the line is terminated with a lumped element further comprises determining the line segment as being characteristically terminated when the drop is larger than a predetermined threshold.

4. The method according to claim 1, wherein determining termination characteristics further comprises determining correlation characteristics of the reflections before and after the at least one anomaly and determining if a first segment of the line has an open termination, is short-circuited or is followed by a second segment of the line based on the correlation characteristics.

5. The method according to claim 4, wherein determining correlation characteristics comprises determining reflection symmetry characteristics of the reflections before and after the at least one anomaly by selecting a first subset of the trace, wherein the first subset comprises the at least one anomaly, determining a second subset based on the first subset adjusted for attenuation, determining a third and a fourth subset from the second subset, the third and fourth subset comprising subsets of the adjusted trace before and after the at least one anomaly, respectively, and determining a correlation coefficient based on the third and fourth subset.

6. The method according to claim 5, wherein the correlation coefficient is defined to show no correlation between the third subset and a reverse order of the fourth subset at the at least one anomaly if the first segment is followed by a second segment and also defined to show a correlation between the third subset and a reverse order of the fourth subset at the at least one anomaly if the first segment is terminated with an open end or is short circuited.

7. The method according to claim 1, wherein each identified anomaly represents a reflection from a respective impedance discontinuity, the reflection having a magnitude defining a peak of the trace.

8. The method according to claim 7, wherein determining termination characteristics further comprises determining impedance change at the at least one anomaly based on the magnitude of the reflection represented by the at least one anomaly.

9. The method according to claim 8, wherein determining impedance change comprises using a linear model approximation of the reflected signal power loss due to attenuation.

10. The method according to claim 8, wherein determining impedance change comprises applying a correction factor based on a model of forth to back transmission losses of the magnitude of the reflection represented by the at least one anomaly.

11. The method according to claim 8, wherein determining impedance change comprises ignoring reflection magnitudes of the reflections from impedance discontinuities before and after the at least one anomaly within a guard zone of the at least one anomaly, in order to reduce the influence of transients on the determination of the impedance change.

12. A line estimation device arranged to determine termination characteristics of an electrically conductive line in a communication system, the line estimation device comprising processing circuitry, wherein the processing circuitry is configured to:
   output a test signal to the line, wherein the test signal is a wideband test signal with a bandwidth arranged to provide an adequate measurement time-resolution,
   receive reflections from impedance discontinuities of the line in response to the test signal,
   form a trace of the reflections,
   identify at least one anomaly in the trace of reflections, and
   determine termination characteristics of the line based on characteristics of the trace before and after the identified at least one anomaly, wherein the determined termination characteristics of the line further comprises determining a type of line termination, and wherein the determined termination characteristics further comprises determining if a segment of the line is terminated with a lumped element based on a drop of the reflection magnitudes following the at least one anomaly.

13. The line estimation device according to claim 12, wherein the line estimation device further comprises a test port having known impedance, and the line estimation device is further adapted to output the test signal to the line via the test port.

14. A computer program comprising computer program code which, when executed in a line estimation device causes the line estimation device to execute a method according to claim 1.

* * * * *